(12) United States Patent
Jacob

(10) Patent No.: US 9,972,537 B2
(45) Date of Patent: May 15, 2018

(54) METHODS OF FORMING GRAPHENE CONTACTS ON SOURCE/DRAIN REGIONS OF FINFET DEVICES

(71) Applicant: GLOBALFOUNDRIES Inc., Grand Cayman (KY)

(72) Inventor: Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 199 days.

(21) Appl. No.: 15/052,098

(22) Filed: Feb. 24, 2016

(65) Prior Publication Data

US 2017/0243791 A1   Aug. 24, 2017

(51) Int. Cl.
*H01L 21/8234* (2006.01)
*H01L 21/8238* (2006.01)
(Continued)

(52) U.S. Cl.
CPC .......... *H01L 21/823431* (2013.01); *H01L 21/02529* (2013.01); *H01L 21/02532* (2013.01); *H01L 21/02538* (2013.01); *H01L 21/283* (2013.01); *H01L 21/823814* (2013.01); *H01L 21/823821* (2013.01); *H01L 21/845* (2013.01); *H01L 27/0886* (2013.01); *H01L 27/1211* (2013.01); *H01L 29/165* (2013.01); *H01L 29/267* (2013.01); *H01L 29/41791* (2013.01);
(Continued)

(58) Field of Classification Search
CPC ....... H01L 29/41791; H01L 2029/7858; H01L 21/823431; H01L 21/845; H01L 27/0886; H01L 27/1211; H01L 29/66795; H01L 29/785; H01L 2924/13067; H01L 29/1606; H01L 21/02532; H01L 29/66545; H01L 29/45; H01L 29/7848
See application file for complete search history.

(56) References Cited

U.S. PATENT DOCUMENTS

| 2012/0074387 A1 | 3/2012 | King |
| 2015/0060881 A1* | 3/2015 | Weber ................ H01L 29/1608 257/77 |

(Continued)

OTHER PUBLICATIONS

Cooke, "Expanding interest in cubic silicon carbide on silicon substrates," SemiconductorTODAY Compounds & Advanced Silicon, vol. 9, Issue 10, pp. 82-85, Dec. 2014/Jan. 2015.
(Continued)

*Primary Examiner* — Joseph C Nicely
(74) *Attorney, Agent, or Firm* — Amerson Law Firm, PLLC

(57) ABSTRACT

One illustrative method disclosed herein includes forming a gate structure above a portion of a fin and performing a first epitaxial growth process to form a silicon-carbide (SiC) semiconductor material above the fin in the source and drain regions of a FinFET device. In this example, the method also includes performing a heating process so as to form a source/drain graphene contact from the silicon-carbide (SiC) semiconductor material in both the source and drain regions of the FinFET device and forming first and second source/drain contact structures that are conductively coupled to the source/drain graphene contact in the source region and the drain region, respectively, of the FinFET device.

24 Claims, 23 Drawing Sheets

(51) Int. Cl.
  *H01L 29/66*   (2006.01)
  *H01L 29/45*   (2006.01)
  *H01L 21/02*   (2006.01)
  *H01L 21/283*  (2006.01)
  *H01L 29/78*   (2006.01)
  *H01L 29/165*  (2006.01)
  *H01L 29/267*  (2006.01)
  *H01L 27/088*  (2006.01)
  *H01L 21/84*   (2006.01)
  *H01L 29/417*  (2006.01)
  *H01L 27/12*   (2006.01)

(52) U.S. Cl.
  CPC ........ *H01L 29/45* (2013.01); *H01L 29/66545* (2013.01); *H01L 29/66795* (2013.01); *H01L 29/7848* (2013.01); H01L 2029/7858 (2013.01); H01L 2924/13067 (2013.01)

(56) References Cited

U.S. PATENT DOCUMENTS

| | | | |
|---|---|---|---|
| 2016/0087062 A1* | 3/2016 | Yin | H01L 29/4916 257/344 |
| 2016/0087063 A1* | 3/2016 | Yin | H01L 29/4916 257/344 |
| 2017/0169958 A1* | 6/2017 | Zhou | H01G 11/26 |
| 2017/0243791 A1* | 8/2017 | Jacob | H01L 21/82381 |

OTHER PUBLICATIONS de Heer et al., "Large area and structured epitaxial graphene produced by confinement controlled sublimination of silicon carbide," Georgia Institute of Technology.

Leong et al., "Low-Contact-Resistance Graphene Devices with Nickel-Etched-Graphene Contacts," Department of Electrical and Computer Engineering, National University of Singapore.

Lippert et al., "Graphene Grown on Ge(001) from Atomic Source," Dec. 20, 2013.

Luxmi et al., "Temperature-dependence of Epitaxial Graphene Formation on SiC(0001)," J. Electron. Mater., 38:17, 2009.

Ming and Zangwill, "Model and Simulations of the Epitaxial Growth of Graphene on Non-Planar 6H-SiC Surfaces," Sep. 16, 2011.

Peng et al., "Direct Transformation of Amorphous Silicon Carbide into Graphene under Low Temperature and Ambient Pressure," Scientific Reports, 3:1148, Jan. 28, 2013.

Peng et al., "Direct Transformation of Amorphous Silicon Carbide into Graphene under Low Temperature and Ambient Pressure," State Key Laboratory of Advanced Technology for Materials Synthesis and Processing, Wuhan University of Technology.

Srivastava et al., "Graphene formed on SiC under various environments: Comparison of Si-face and C-face," Dept. Physics, Carnegie Mellon University.

Yu et al., "New Synthesis Method for the Growth of Epitaxial Graphene," Materials Science Division, Lawrence Berkeley National Laboratory.

* cited by examiner

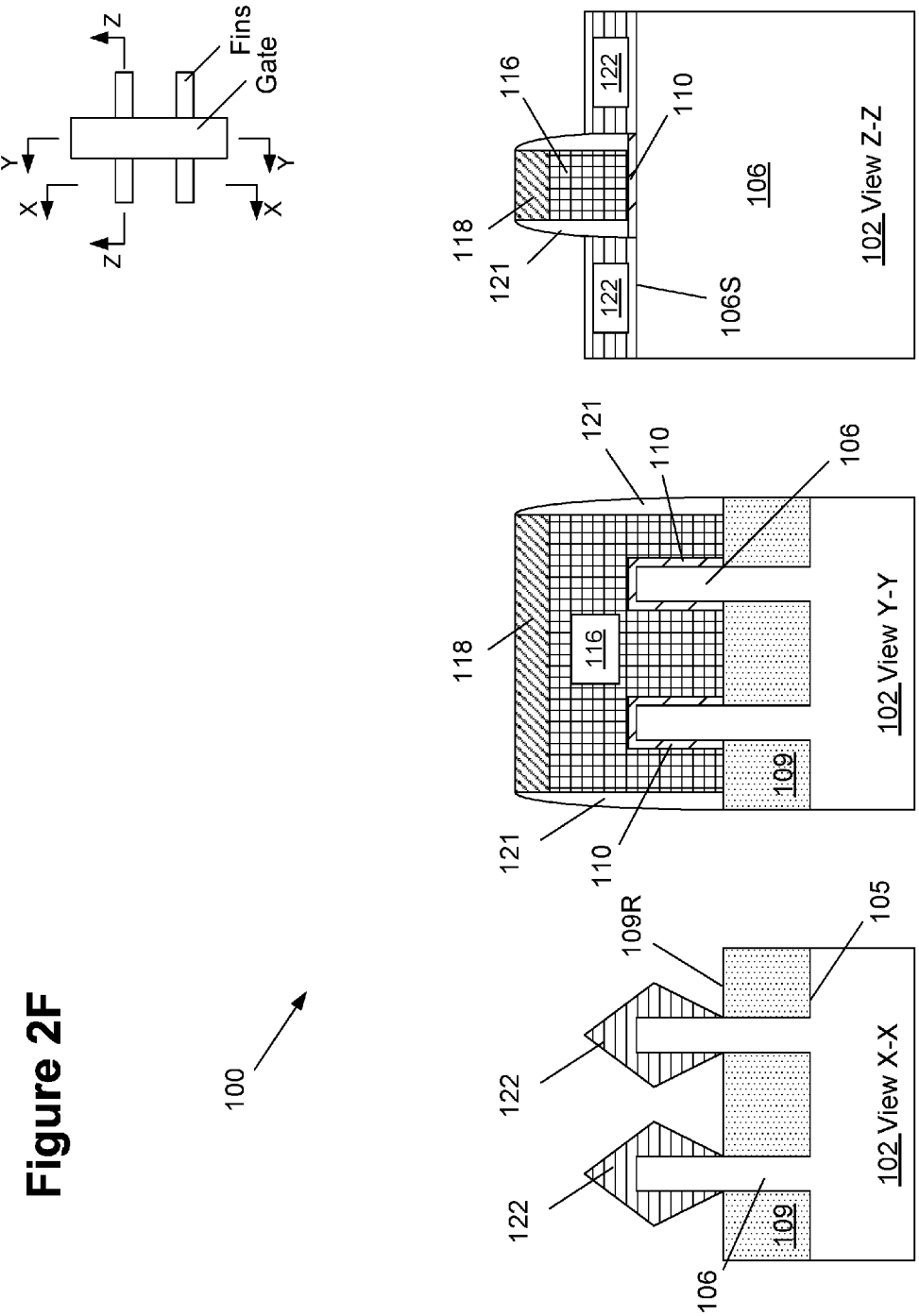

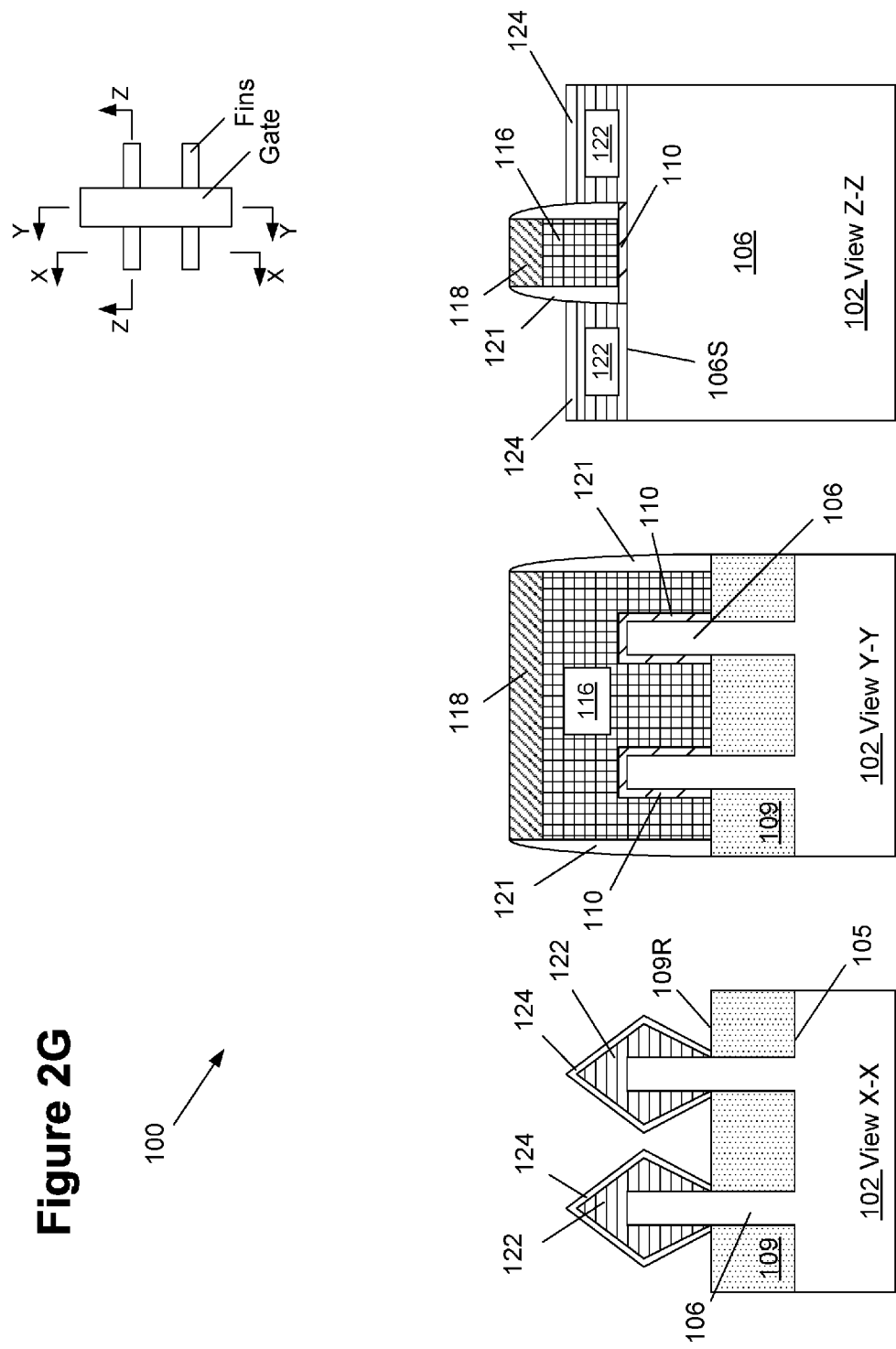

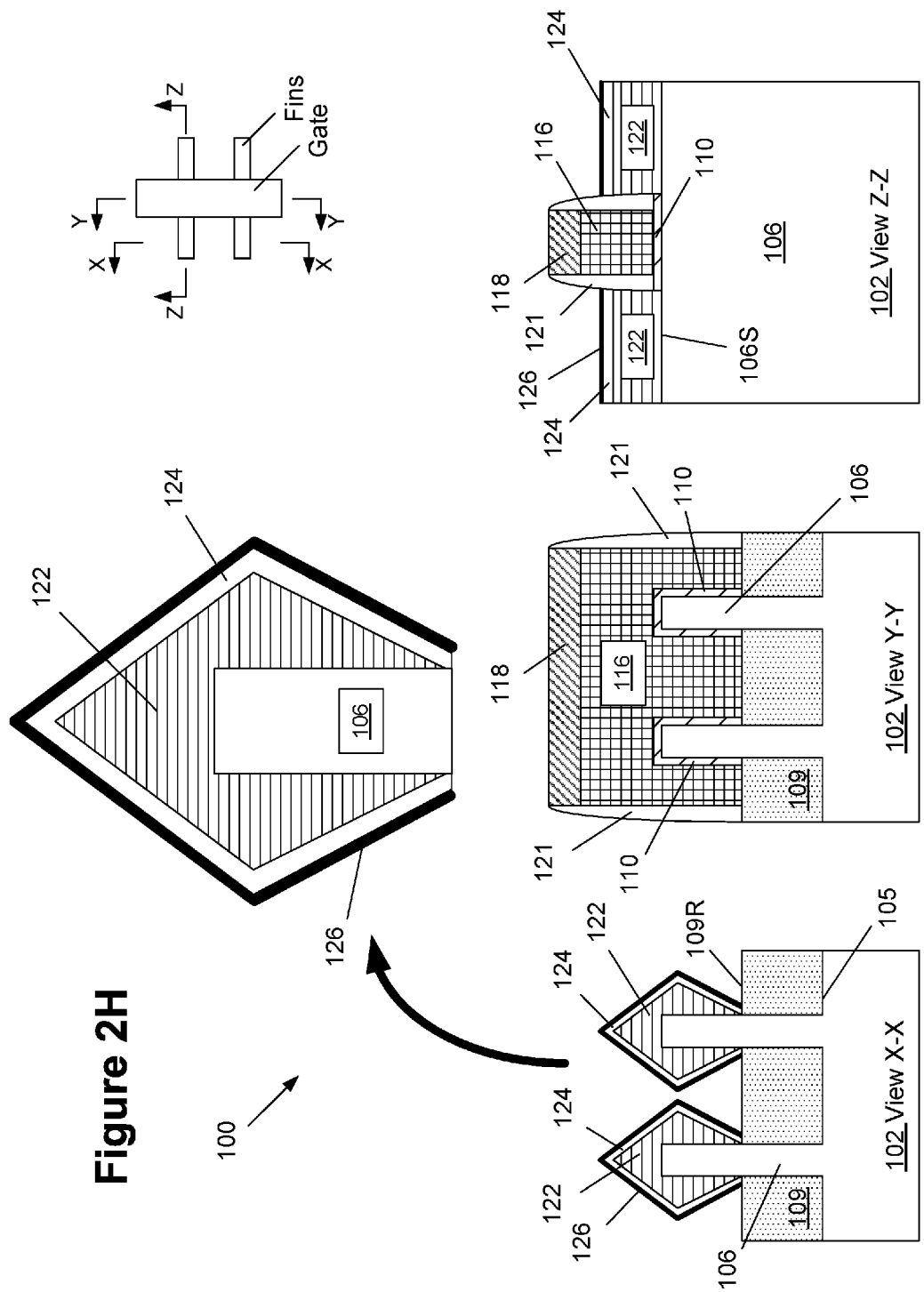

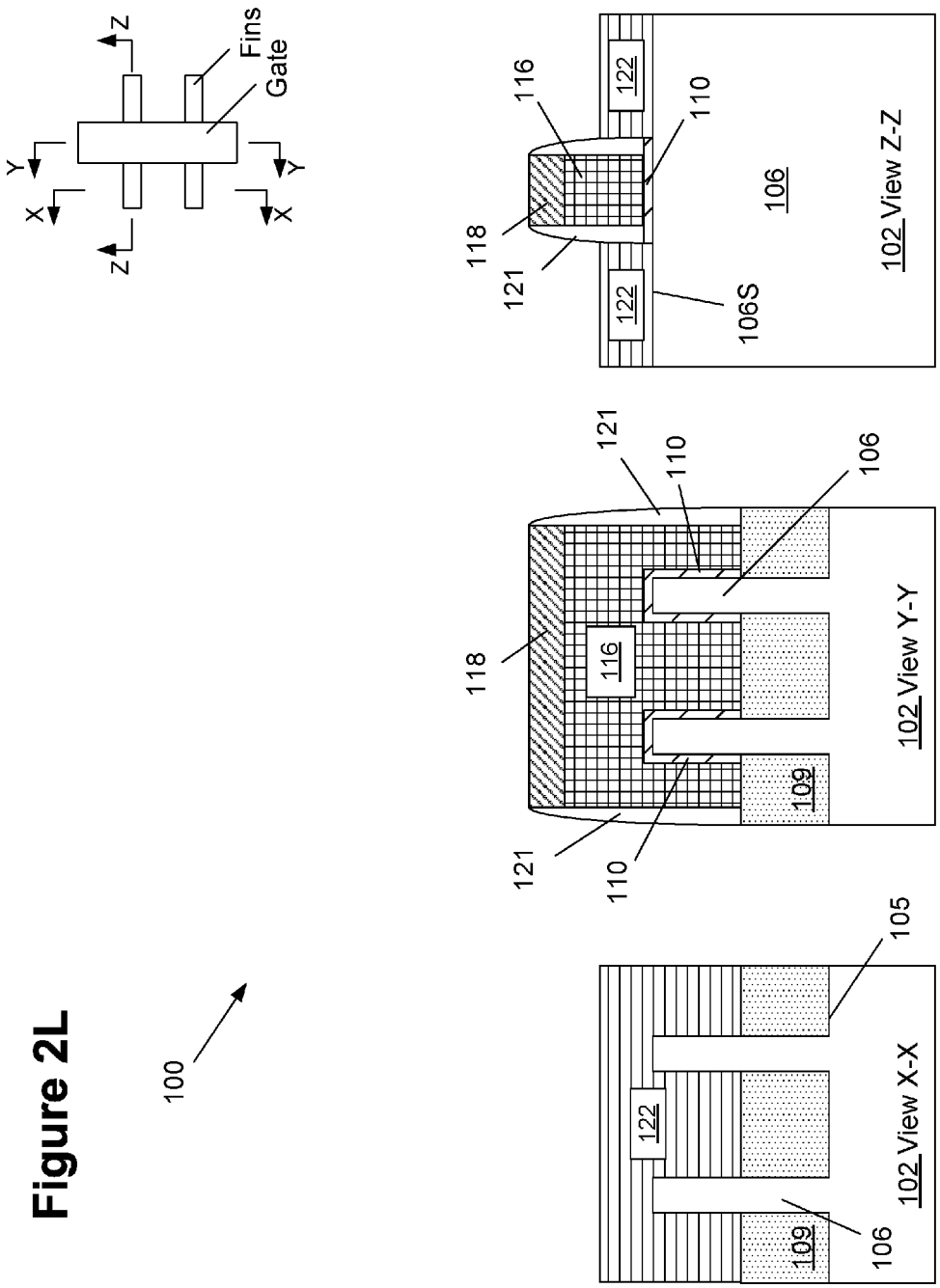

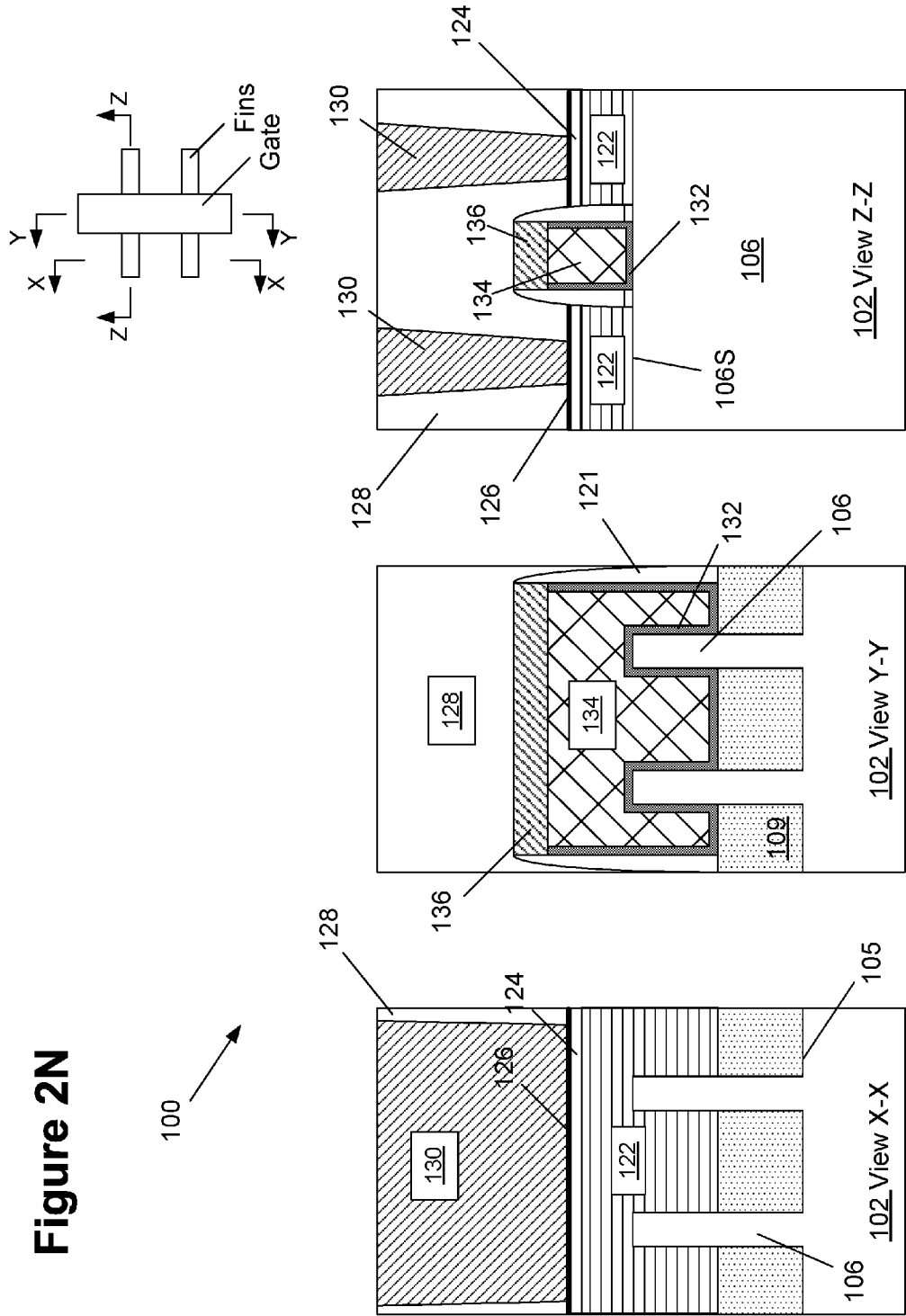

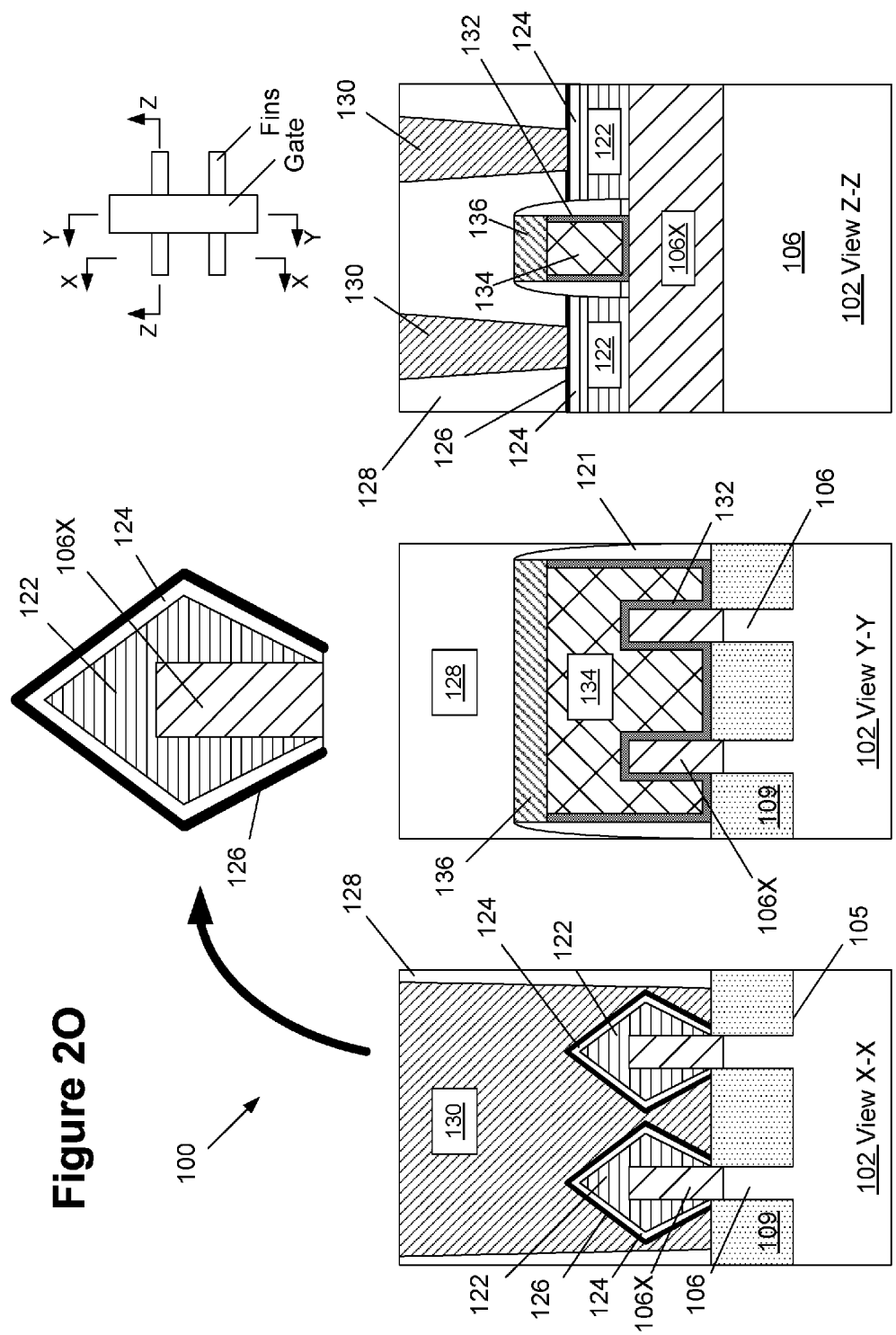

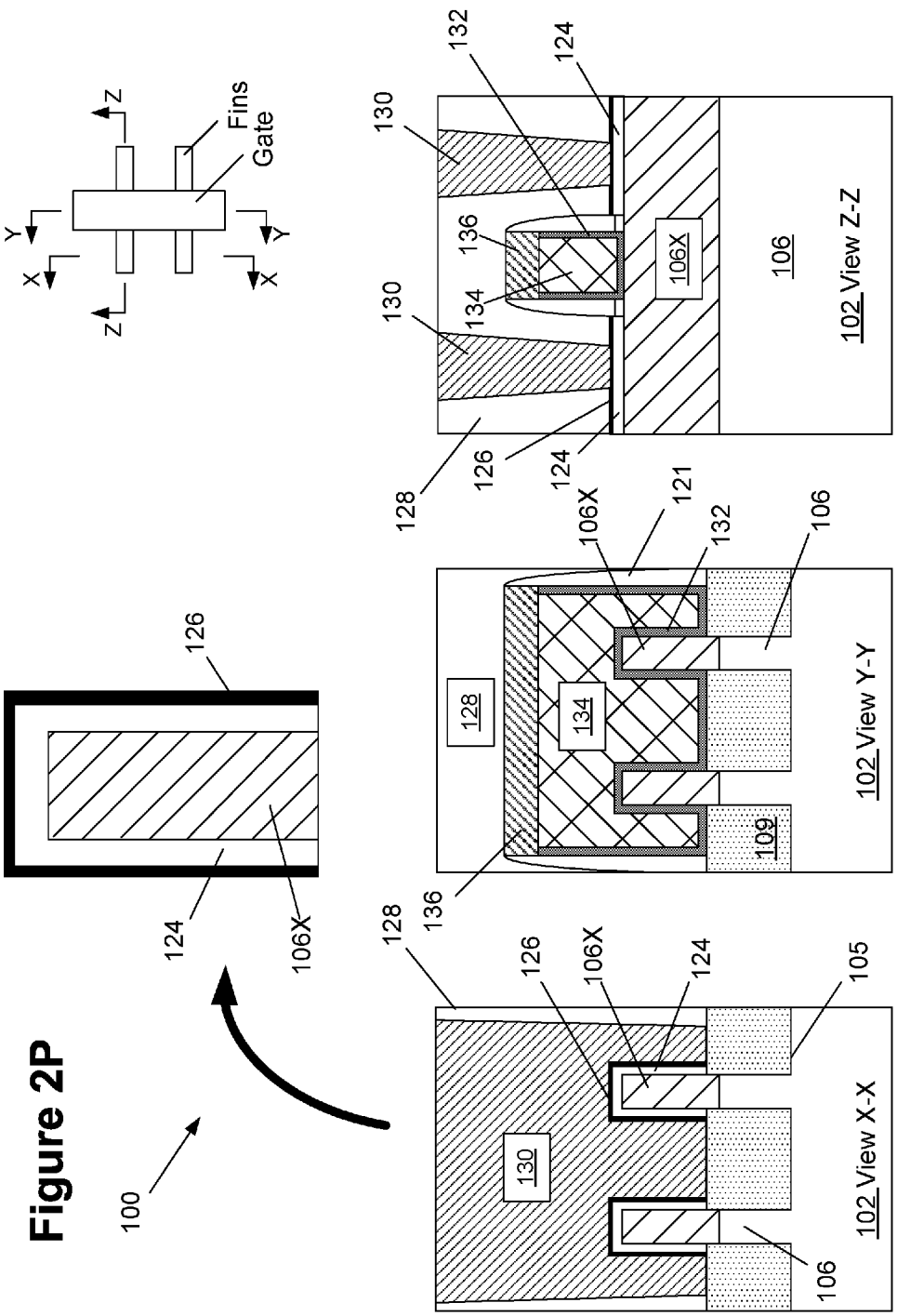

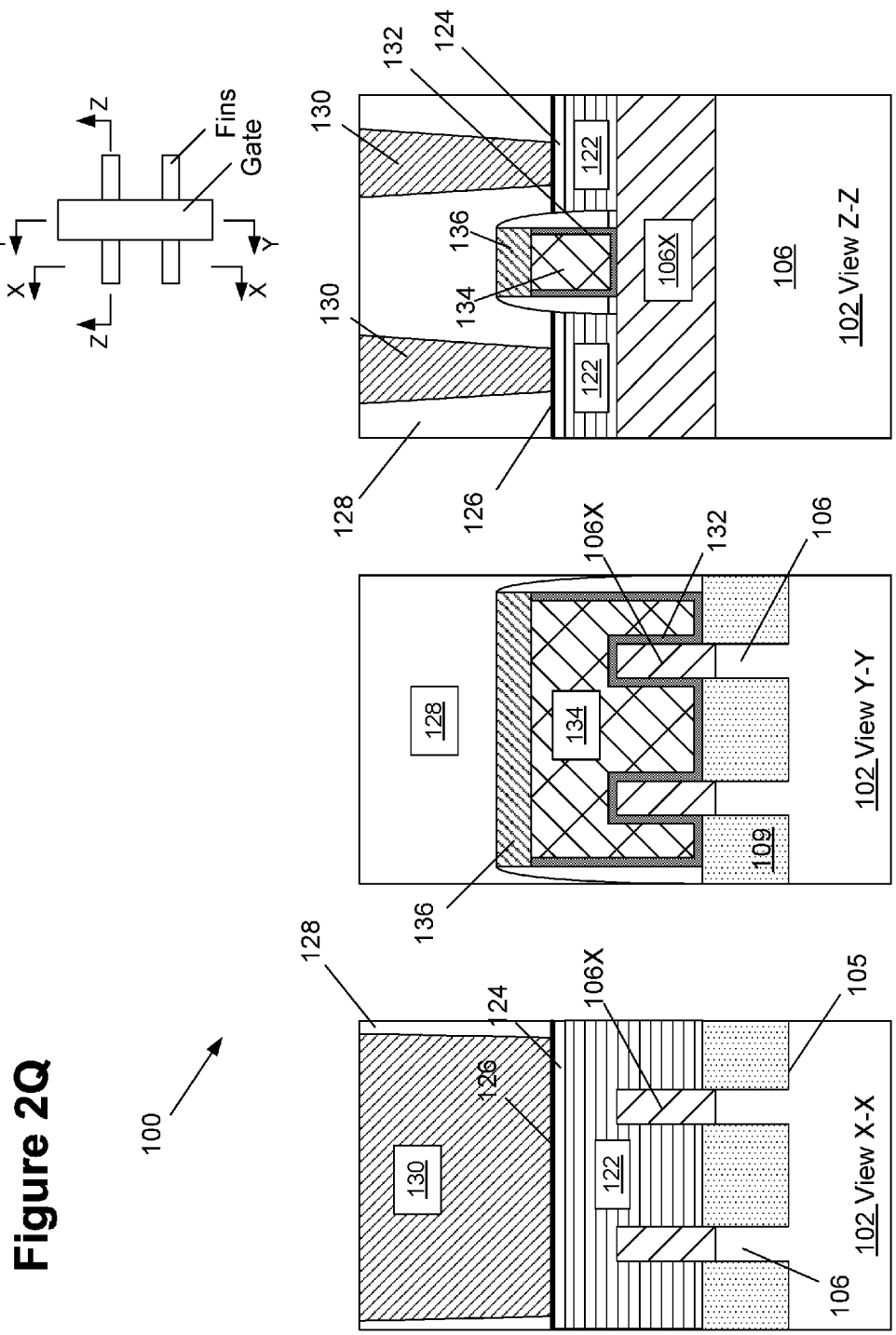

US 9,972,537 B2

1

METHODS OF FORMING GRAPHENE CONTACTS ON SOURCE/DRAIN REGIONS OF FINFET DEVICES

BACKGROUND OF THE INVENTION

1. Field of the Invention

Generally, the present disclosure relates to the manufacturing of semiconductor devices, and, more specifically, to various methods of forming graphene contacts on source/drain regions of FinFET devices, and the resulting FinFET device structures.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

A conventional FET is a planar device. To improve the operating speed of planar FETs, and to increase the density of planar FETs on an integrated circuit product, device designers have greatly reduced the physical size of planar FETs over the past decades. More specifically, the channel length of planar FETs has been significantly decreased, which has resulted in improving the switching speed and in lowering operation currents and voltages of planar FETs. However, decreasing the channel length of a planar FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the planar FET as an active switch is degraded.

FIG. 1A is a perspective view of an illustrative prior art FinFET semiconductor device 10 that is formed above a semiconductor substrate 12 at an intermediate point during fabrication. In this example, the FinFET device 10 includes three illustrative fins 14, an isolation material 15 (e.g., silicon dioxide), a simplistically depicted gate structure 16, a sidewall spacer 18 and a gate cap layer 20. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode for the device 10. The gate structure 16 may be formed using either so-called "gate last" or "replacement gate" manufacturing techniques. The fins

2

14 have a three-dimensional configuration: a height H, a width W and an axial length L. The direction of current travel when the device 10 is operational, i.e., the gate length (GL) of the device 10, corresponds to the direction of the axial length L of the fins 14. The portions of the fins 14 covered by the gate structure 16 are the channel regions of the FinFET device 10, while the portions of the fins 14 positioned laterally outside of the spacers 18 are part of the source/drain regions of the device 10. Although not depicted, the portions of the fins 14 in the source/drain regions may have additional epi semiconductor material formed thereon.

FIG. 1B is a perspective view of yet another illustrative prior art FinFET semiconductor device 10A that is formed above a semiconductor substrate 30. In this example, the FinFET device 10A includes three illustrative fins 32, an isolation material 34, a simplistically depicted gate structure 36, a sidewall spacer 38 and a gate hard mask 40. The fins 32 have a three-dimensional configuration: a height H, a width W and an axial length L. In this example, the fins 32 are comprised of a substrate fin portion 32A and an alternative fin material portion 32B, e.g., SiGe, SiC, etc. The substrate fin portion 32A may be made of silicon, i.e., the same material as the substrate 30, and the alternative fin material portion 32B may be made of a material other than the substrate material, such as, for example, a compressively stressed silicon-germanium material for a PFET device or a tensile stressed silicon-carbide material for an NFET device. Such alternative materials are formed in an effort to increase the current carrying capabilities of the FinFET devices.

Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects. When an appropriate voltage is applied to the gate electrode of a FinFET device, the surfaces (and the inner portion near the surface) of the fins 14, 32, i.e., the vertically oriented sidewalls and the top upper surface of the fin (for a tri-gate device), form a surface inversion layer or a volume inversion layer that contributes to current conduction. In a FinFET device with a single fin, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Over recent years, due to the improvements in the performance of transistor devices, one limiting factor relating to the operating speed of the final integrated circuit product is no longer the individual transistor elements but the electrical performance of the complex wiring system that is formed above the device level that includes the actual semiconductor-based circuit elements. Typically, due to the large number of circuit elements and the required complex layout of modern integrated circuits, the electrical connections of the individual circuit elements or "wiring" for the circuits cannot be formed or positioned at the same level that contains the actual circuit elements such as transistors. Rather, the electrical wiring for the integrated circuit products is comprised of several metallization layers positioned over the device level. Such metallization layers generally include metal-containing lines providing the intra-level electrical connections, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. Such vertical contact structures are considered to be "device-level" contacts or simply "contacts" within the industry, as they contact the "device" that is formed in the silicon substrate. The contact structures may comprise contact elements or contact plugs having a generally square-like or round shape that are formed in an interlayer dielectric material, which in turn encloses and passivates the circuit elements. In other applications, the contact structures may be line-type features, e.g., source/drain contact structures.

Another problem with continued scaling of transistor devices is that the electrical resistance between the conductive device-level contacts and the transistor element is becoming a larger portion of the overall electrical resistance. Traditionally, metal silicide layers or regions are formed in the source/drain regions of a device and on the gate electrode of a device in order to reduce electrical contact resistance where contact will be made by a device level contact. The typical steps performed to form metal silicide regions are: (1) depositing a layer of refractory metal (e.g., nickel, platinum, etc.); (2) performing an initial heating process causing the refractory metal to react with underlying silicon-containing material; (3) performing an etching process to remove unreacted portions of the layer of refractory metal; and (4) performing an additional heating process to form the final phase of the metal silicide. In other cases, a metal silicide region may be formed by depositing a thin liner of metal, such as Ti or NiPt, depositing a TiN barrier on the liner and depositing a low-resistance conducting metal, such as W, on the barrier. The silicide is formed between the liner and conducting metal during the thermal process that occurs when the conducting metal is deposited. As such, no additional refractory metal stripping process is needed.

Ideally, the contact area between the metal silicide layer or region and the underlying silicon or epi semiconductor material (in the source/drain region) could simply be increased. In the case of FinFET devices that have additional epi semiconductor material formed on the fins in the source/drain regions of the device, this could theoretically be accomplished by forming the additional epi material on the fins in an un-merged condition, i.e., a situation where there is no contact between additional epi material on adjacent fins, and thereafter forming an individual metal silicide layer that wraps around each of the separated epi materials. In practice, this is a very difficult task for several reasons. First, when epi semiconductor material is grown on a fin, it is very difficult to control the thickness of the epi semiconductor material. Thus, the epi material may unintentionally be merged together, thereby preventing the formation of the wrap-around metal silicide layers. One possible solution to avoid such unintended fin merger would be to form the epi material on the fin to a very small thickness to virtually assure that unintended fin merger does not occur. The drawbacks to this approach are that such a very small volume of epi material will tend to increase the overall resistance and such a thin layer of epi material may be substantially consumed by the metal silicide material and/or damaged during the contact formation process.

The present disclosure is directed to various methods of forming graphene contacts on source/drain regions of FinFET devices, and the resulting FinFET device structures, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming graphene contacts on source/drain regions of FinFET devices, and the resulting FinFET device structures. One illustrative method disclosed herein includes, among other things, forming a FinFET device by forming a fin in a semiconductor substrate comprised of a first semiconductor material, forming a gate structure above a portion of the fin and performing a first epitaxial growth process to form a silicon-carbide (SiC) semiconductor material above the fin in the source and drain regions of the FinFET device, the silicon-carbide semiconductor material being a different semiconductor material than the first semiconductor material of the substrate. In this example, the method also includes performing a heating process so as to form a source/drain graphene contact from the silicon-carbide semiconductor material in both the source and drain regions of the FinFET device and forming first and second source/drain contact structures that are conductively coupled to the source/drain graphene contact in the source region and the drain region, respectively, of the FinFET device.

Another illustrative method disclosed herein includes, among other things, forming a FinFET device by forming a fin in a substrate comprised of a first semiconductor material, forming a gate structure above a portion of the fin, performing a first epitaxial growth process to form a source/drain epi semiconductor material on the fin, wherein the source/drain epi semiconductor material is different from the first semiconductor material of the substrate, and performing a second epitaxial growth process to form a silicon-carbide (SiC) semiconductor material above the source/drain epi semiconductor material in the source and drain regions of the FinFET device, the silicon-carbide (SiC) semiconductor material being different than the first semiconductor material of the substrate. In this example, the method further includes performing a heating process so as to form a source/drain graphene contact from the silicon-carbide (SiC) semiconductor material in both the source and drain regions of the FinFET device and forming first and second source/drain contact structures that are conductively coupled to the source/drain graphene contact in the source region and the drain region, respectively, of the FinFET device.

One illustrative method disclosed herein for forming a CMOS integrated circuit product comprised of a PMOS FinFET device and an NMOS FinFET includes, among other things, forming first and second fins in a substrate comprised of a first semiconductor material, the first and second fins being formed for the PMOS FinFET device and the NMOS FinFET device, respectively, forming first and second gate structures above a portion of the first and second fins, respectively, forming a first source/drain epi semiconductor material on the first fin in the source and drain regions of the PMOS FinFET device, wherein the first source/drain epi semiconductor material is different from the first semiconductor material of the substrate, and forming a second source/drain epi semiconductor material on the second fin in the source and drain regions of the NMOS FinFET device, wherein the second source/drain epi semiconductor material is different from the first and the first source/drain epi semiconductor materials. In this example, the method also includes forming a silicon-carbide (SiC) semiconductor material on and in contact with the first source/drain epi semiconductor material in the source and drain regions of the PMOS FinFET device and on and in contact with the second source/drain epi semiconductor material in the source and drain regions of the NMOS device, the silicon-carbide (SiC) semiconductor material being different than the first semiconductor material of the substrate, performing a heating process so as to form a source/drain graphene contact from the silicon-carbide (SiC) semiconductor material in both the source and drain regions of both the PMOS and NMOS FinFET devices, and forming a plurality of source/drain contact structures, each of which is conductively coupled to one of the source/drain graphene contacts.

BRIEF DESCRIPTION OF THE DRAWINGS

The disclosure may be understood by reference to the following description taken in conjunction with the accompanying drawings, in which like reference numerals identify like elements, and in which.

Figure 1A:
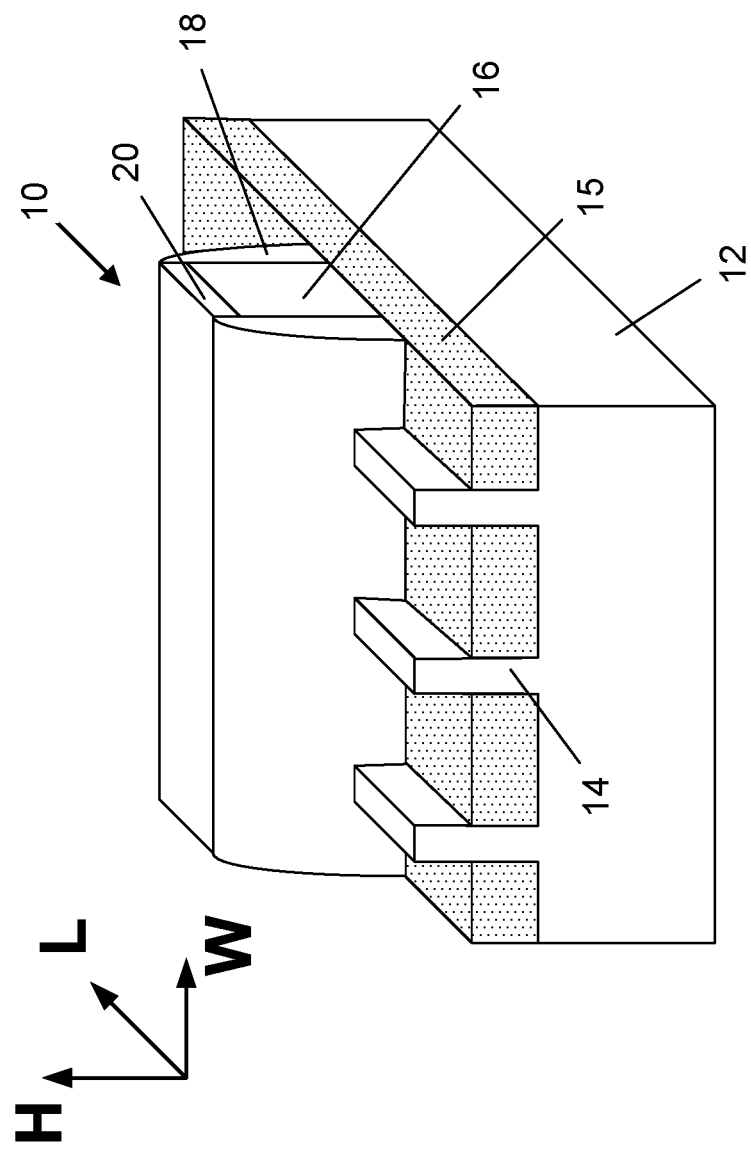
FIGS. 1A-1B depict illustrative examples of prior art FinFET devices.
Figure 1B:
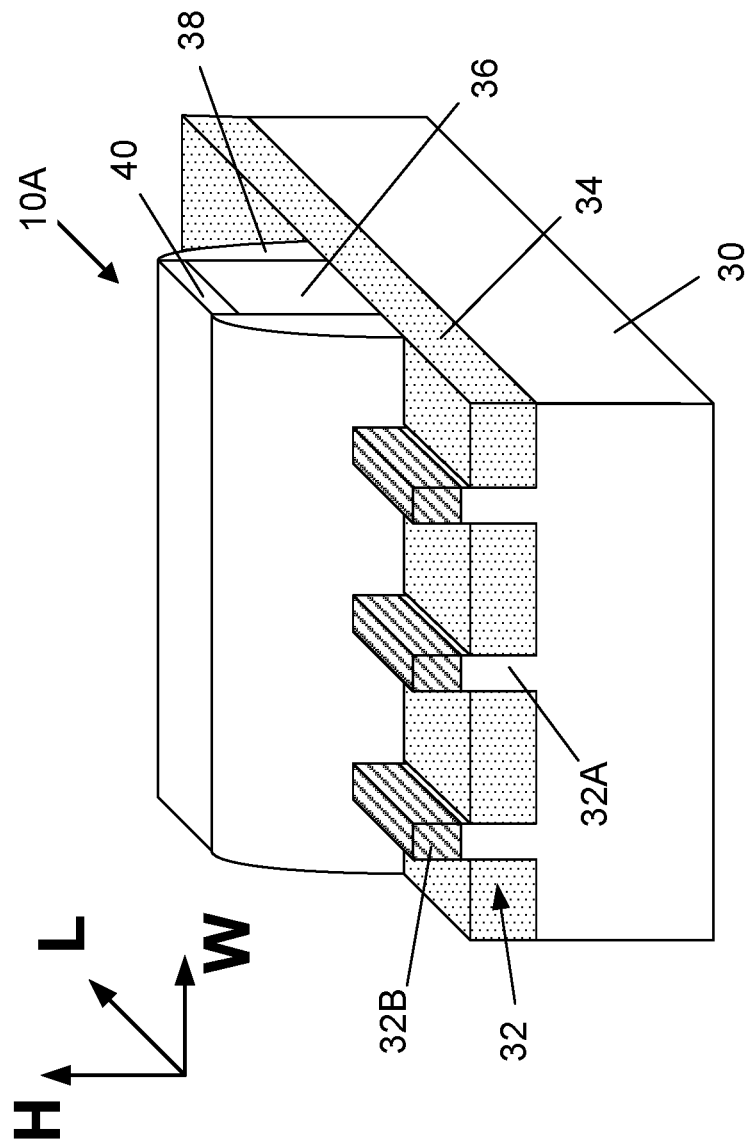

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming graphene contacts on source/drain regions of FinFET devices, and the resulting FinFET device structures. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

As will be appreciated by those skilled in the art after a complete reading of the present application, various doped regions, e.g., source/drain regions, halo implant regions, well regions and the like, for the devices are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spincoating techniques, etc. The thicknesses of these various layers of material may also vary depending upon the particular application. With reference to the attached figures, various illustrative embodiments of the methods and devices disclosed herein will now be described in more detail.

Figure 2A:
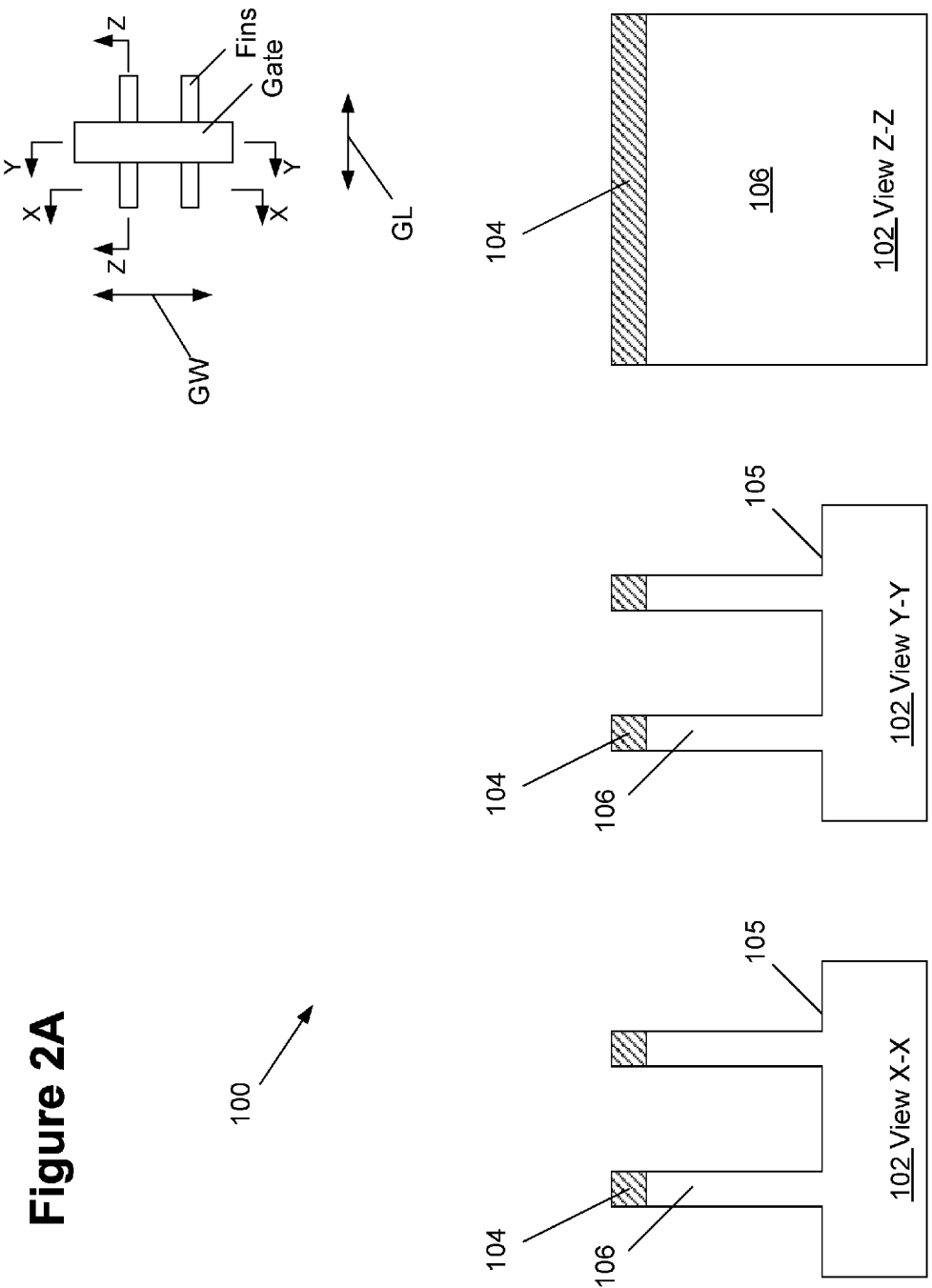
FIGS. 2A-2U depict various illustrative methods disclosed herein of forming graphene contacts on source/drain regions of FinFET devices, and the resulting FinFET device structures.
Figure 2B:
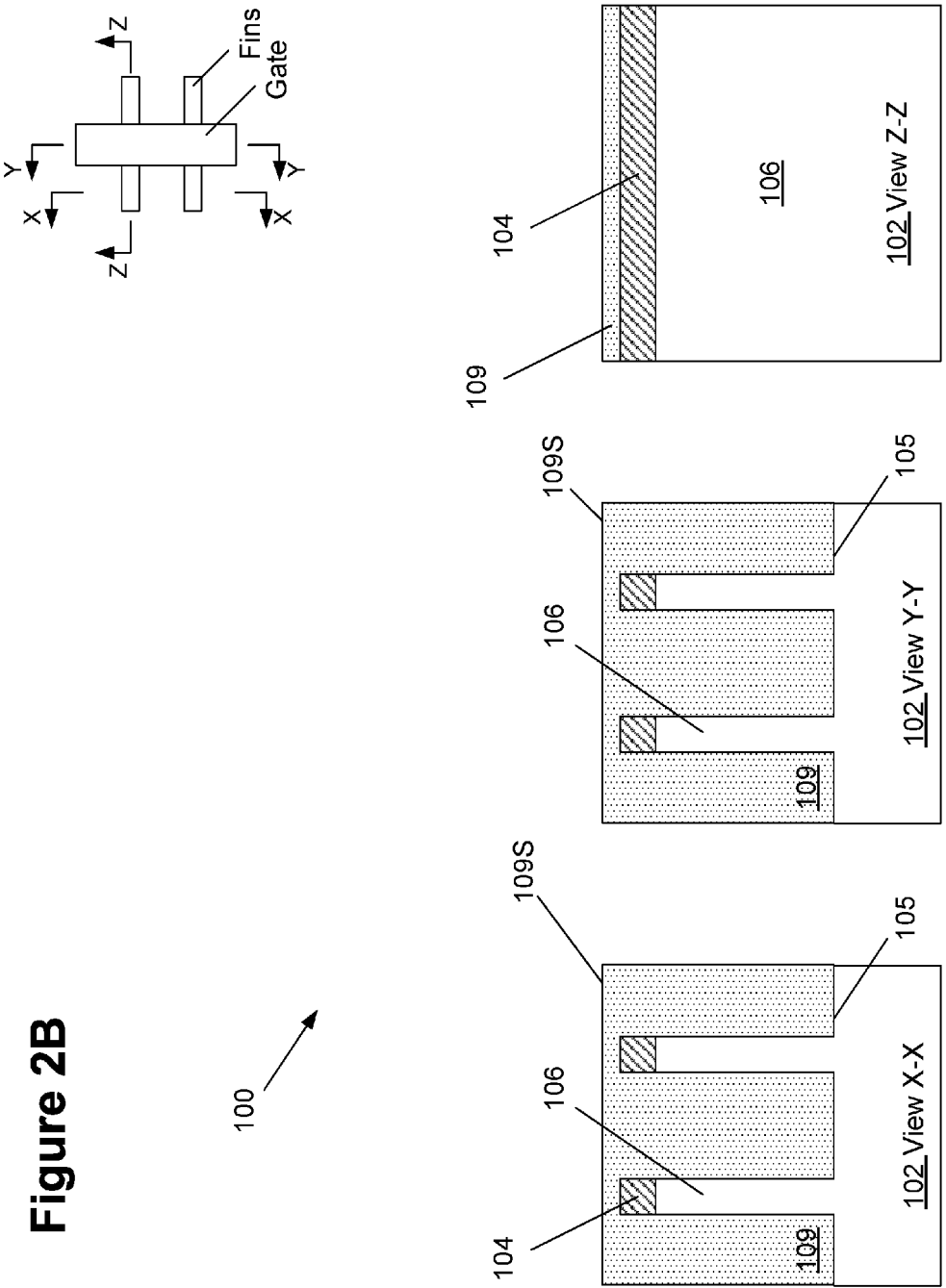
Figure 2C:
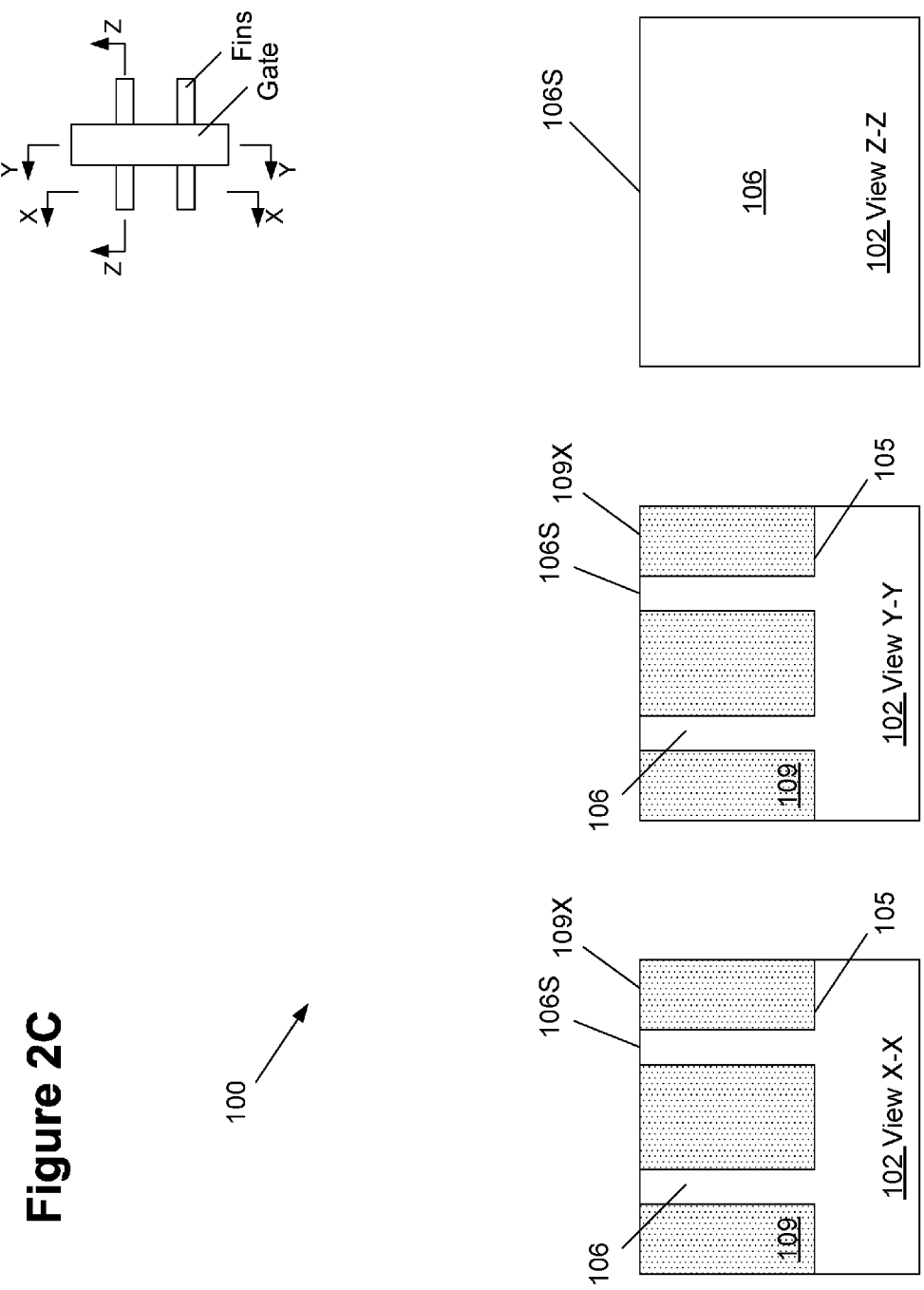
Figure 2D:
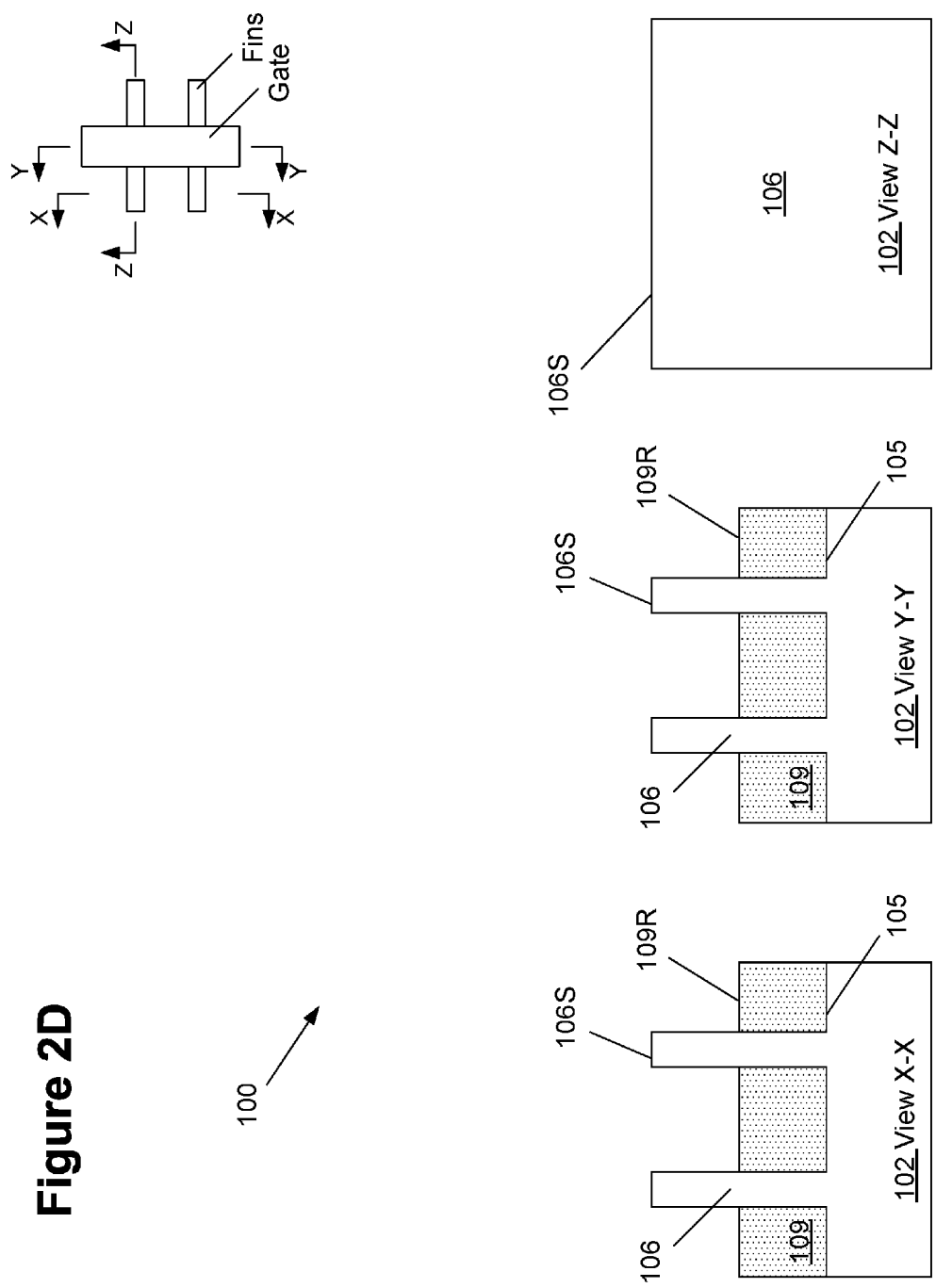
Figure 2E:
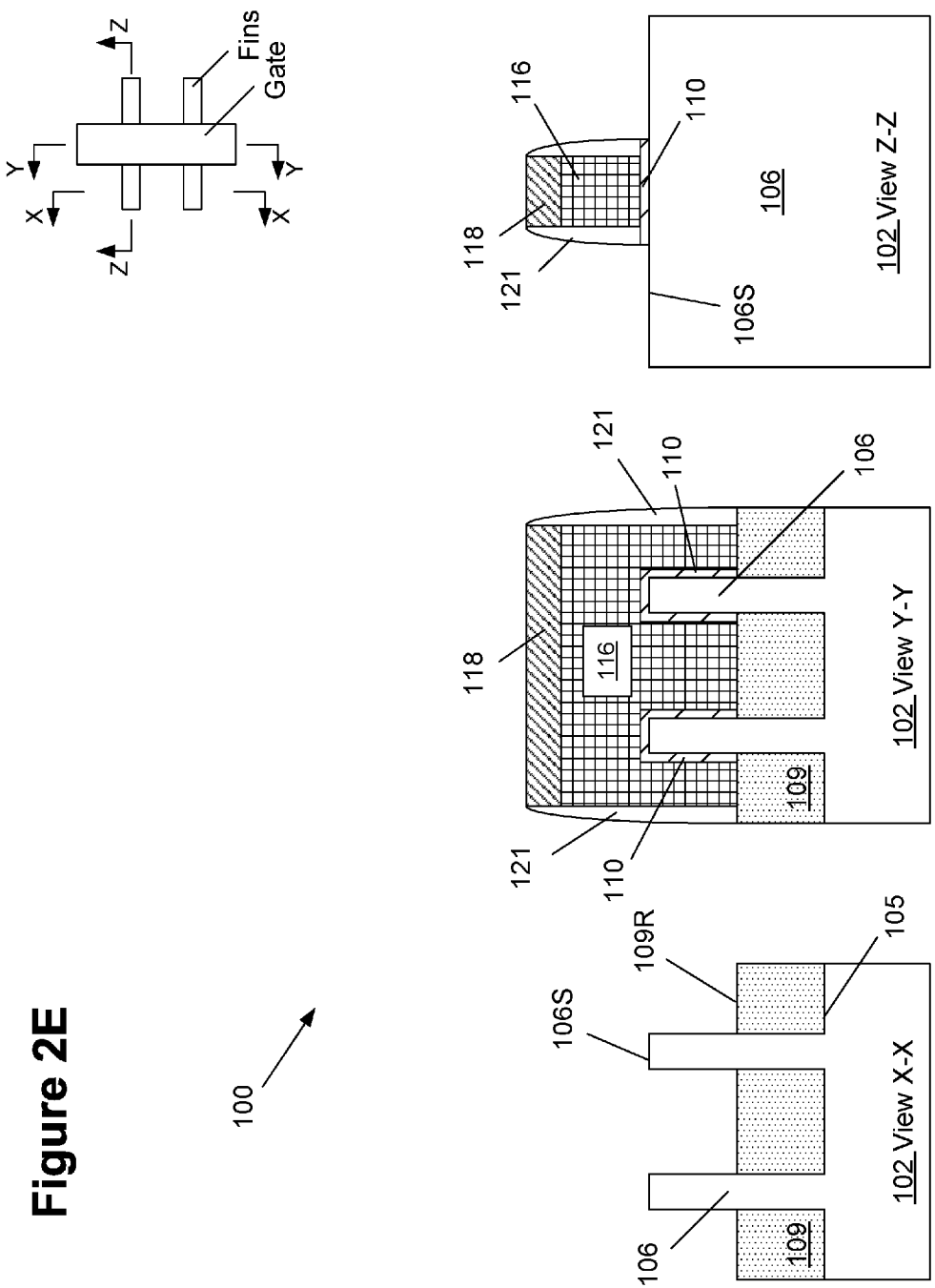
Figure 2I:
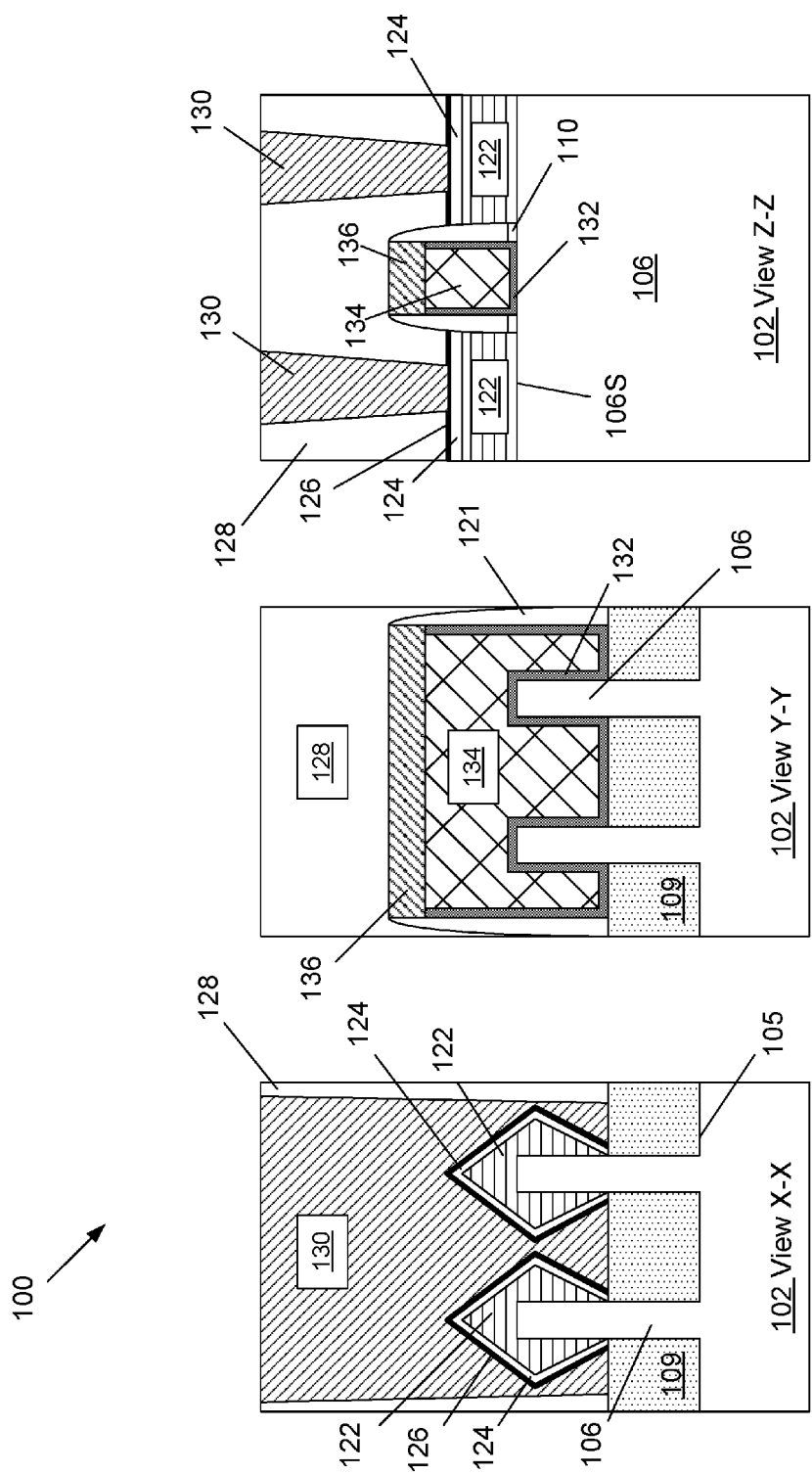
Figure 2J:
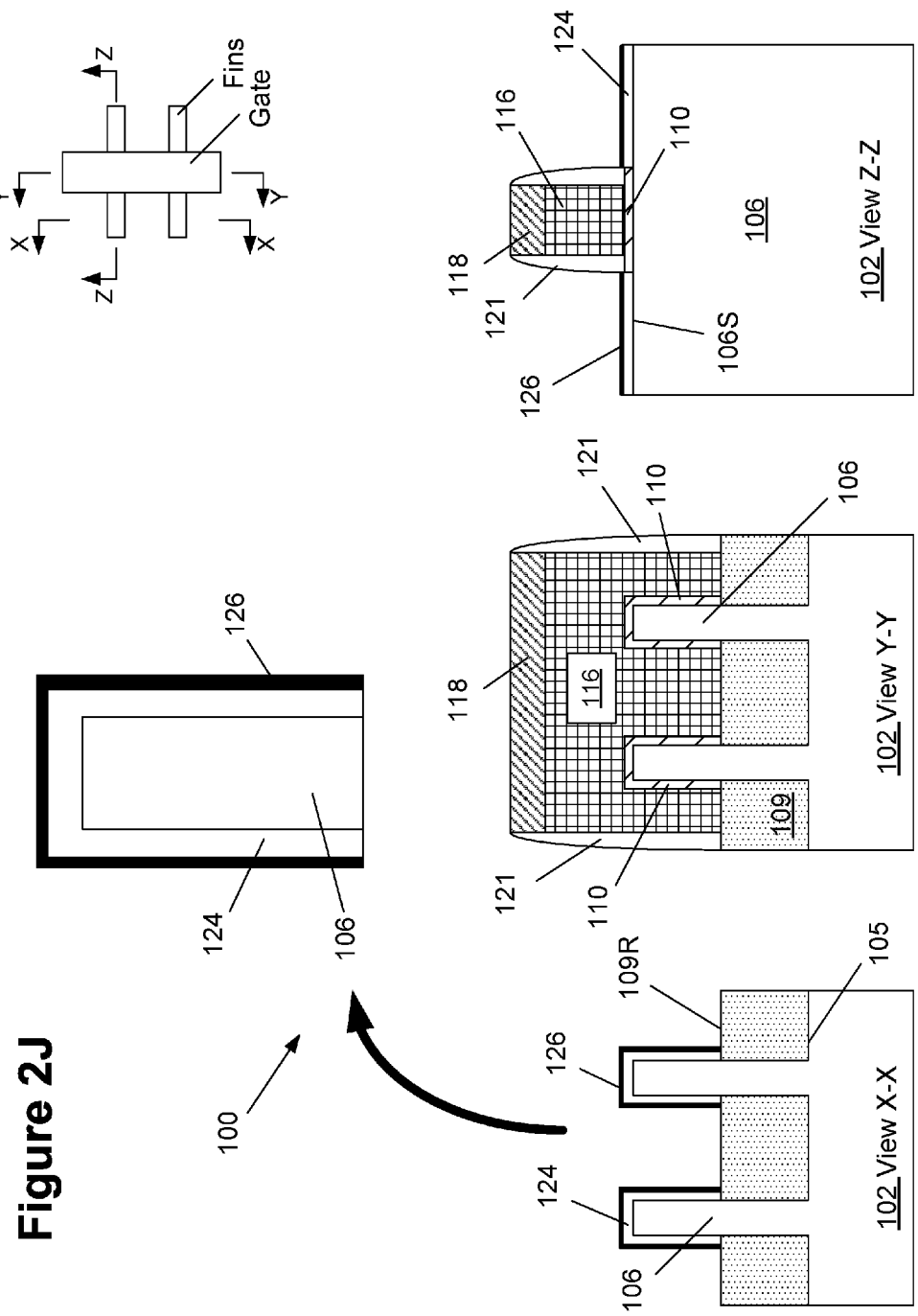
Figure 2K:
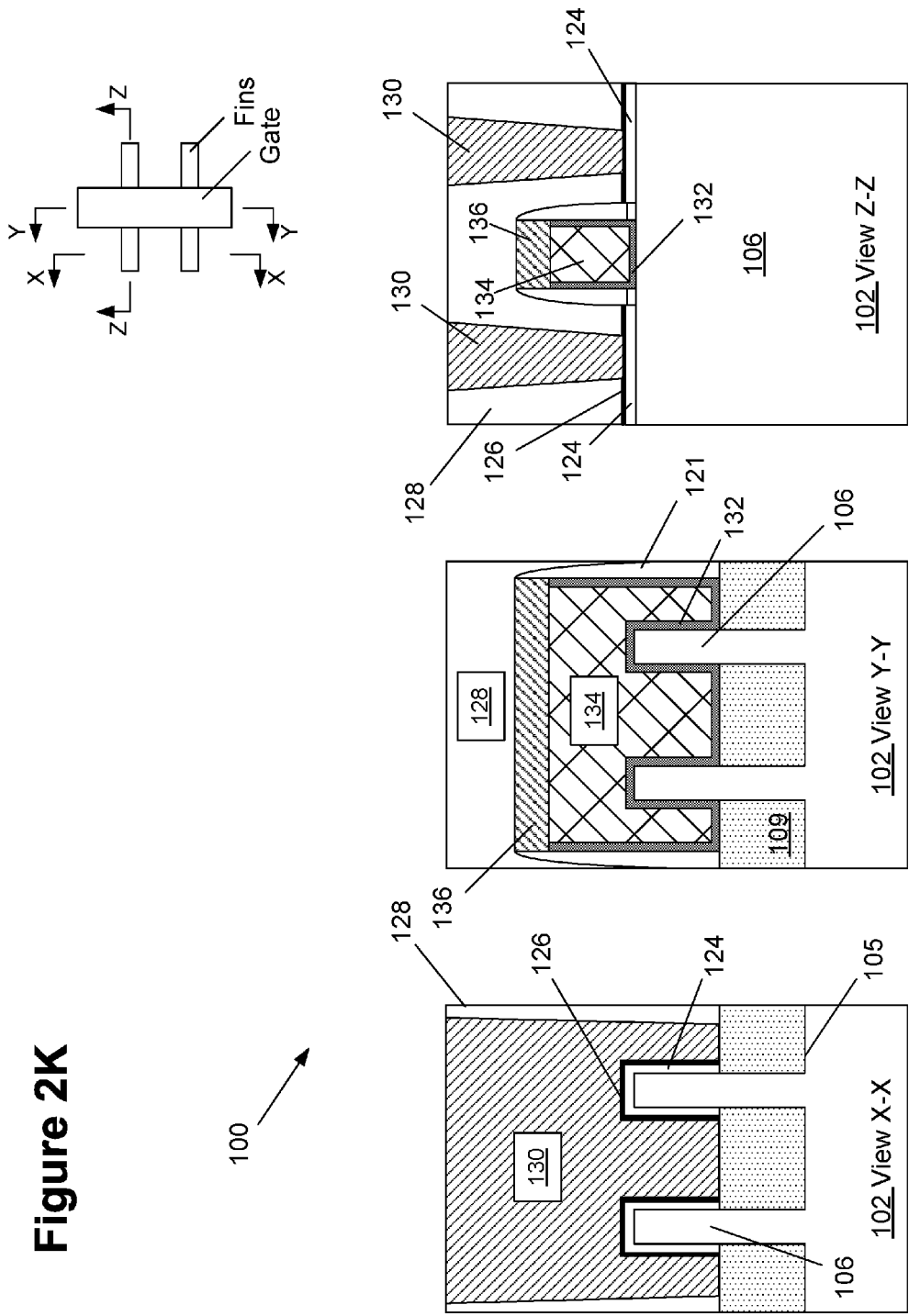
Figure 2M:
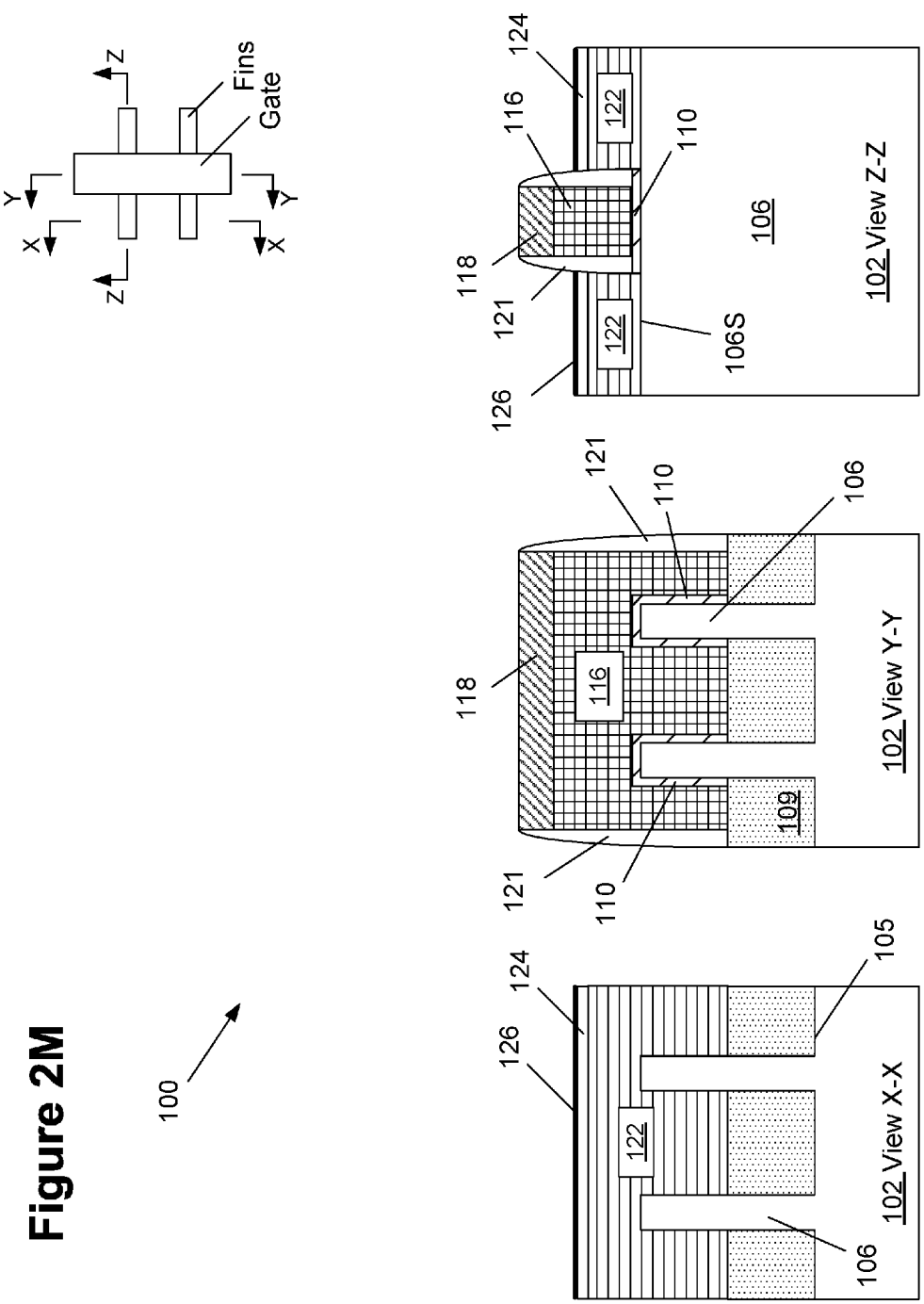
Figure 2R:
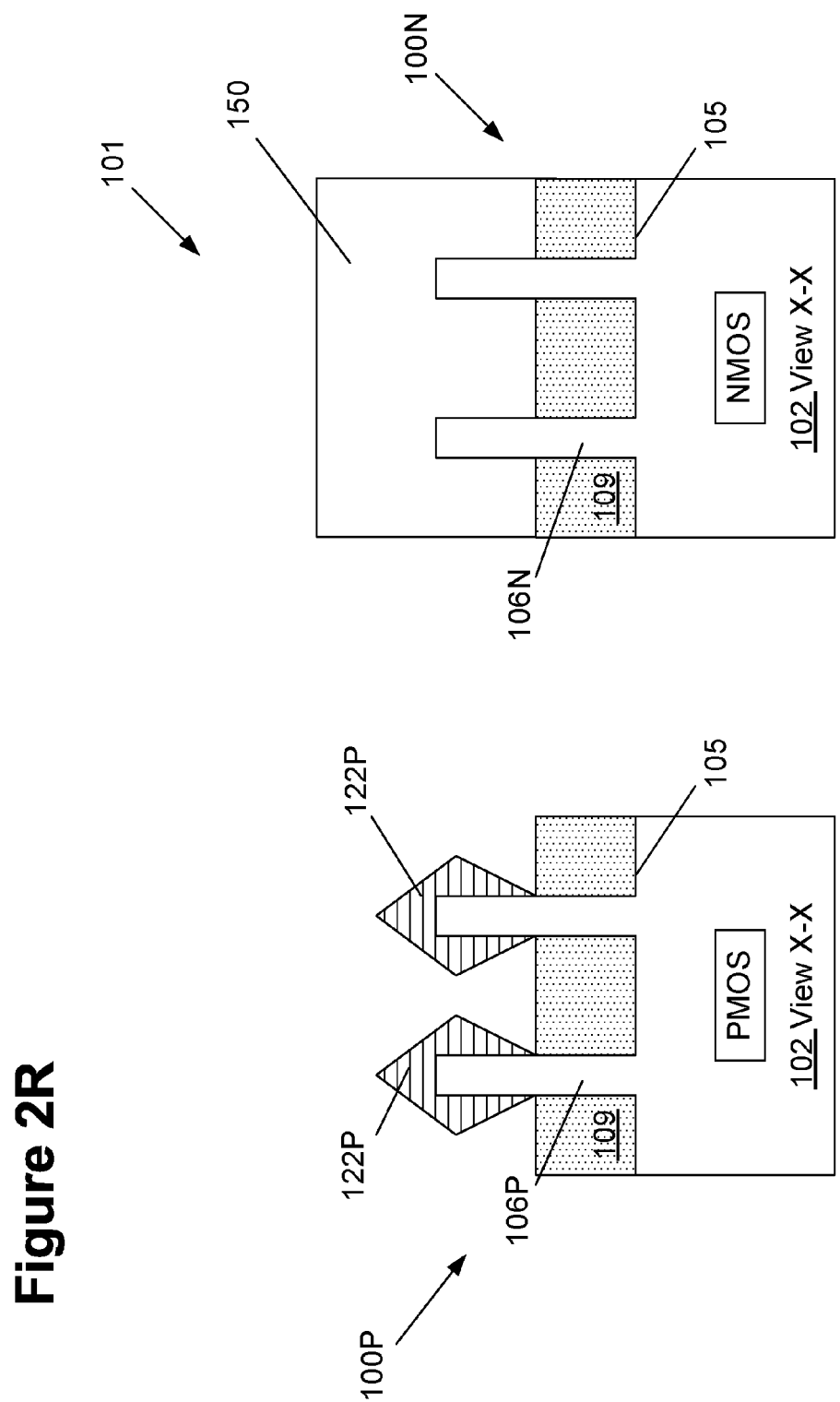
Figure 2S:
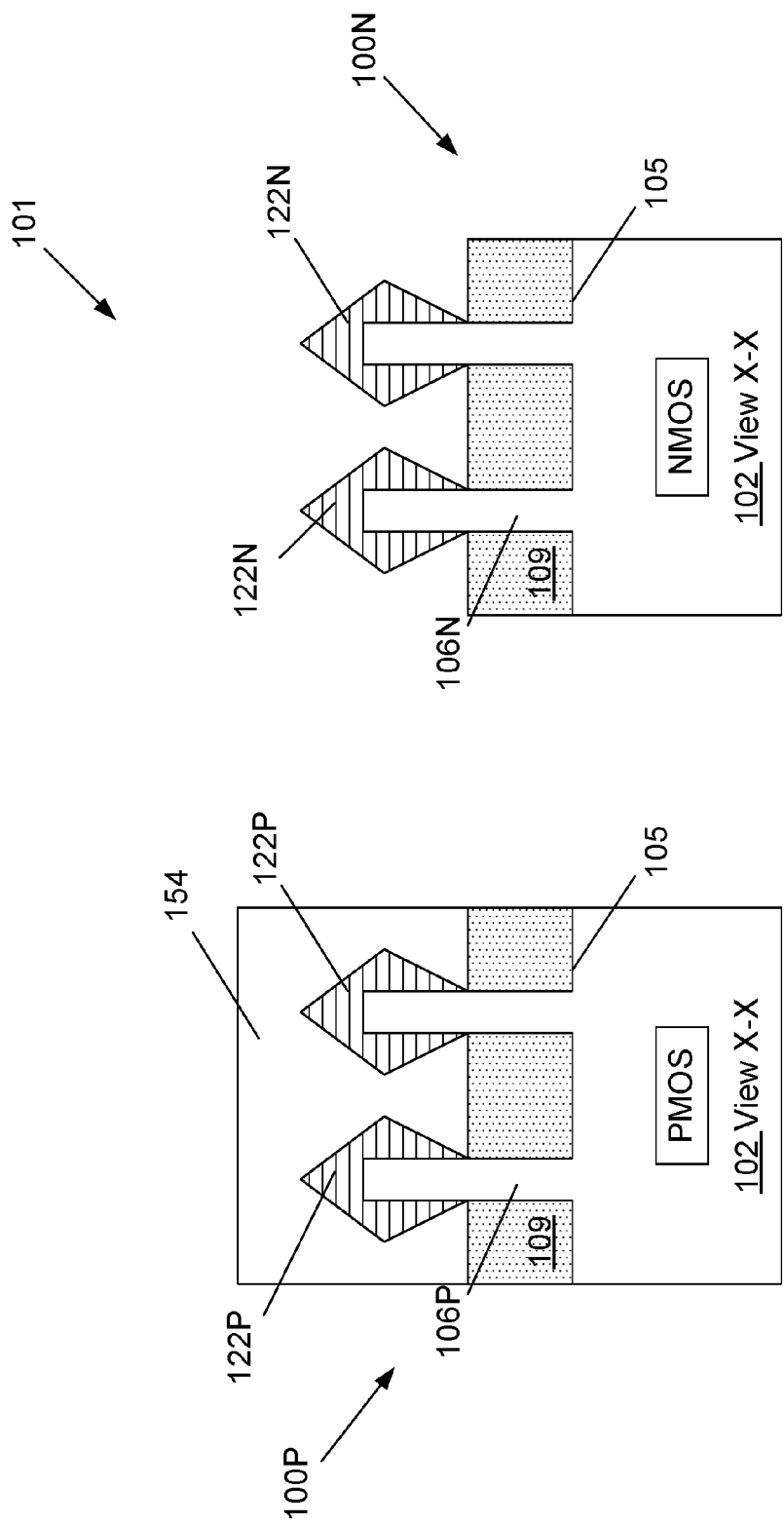
Figure 2T:
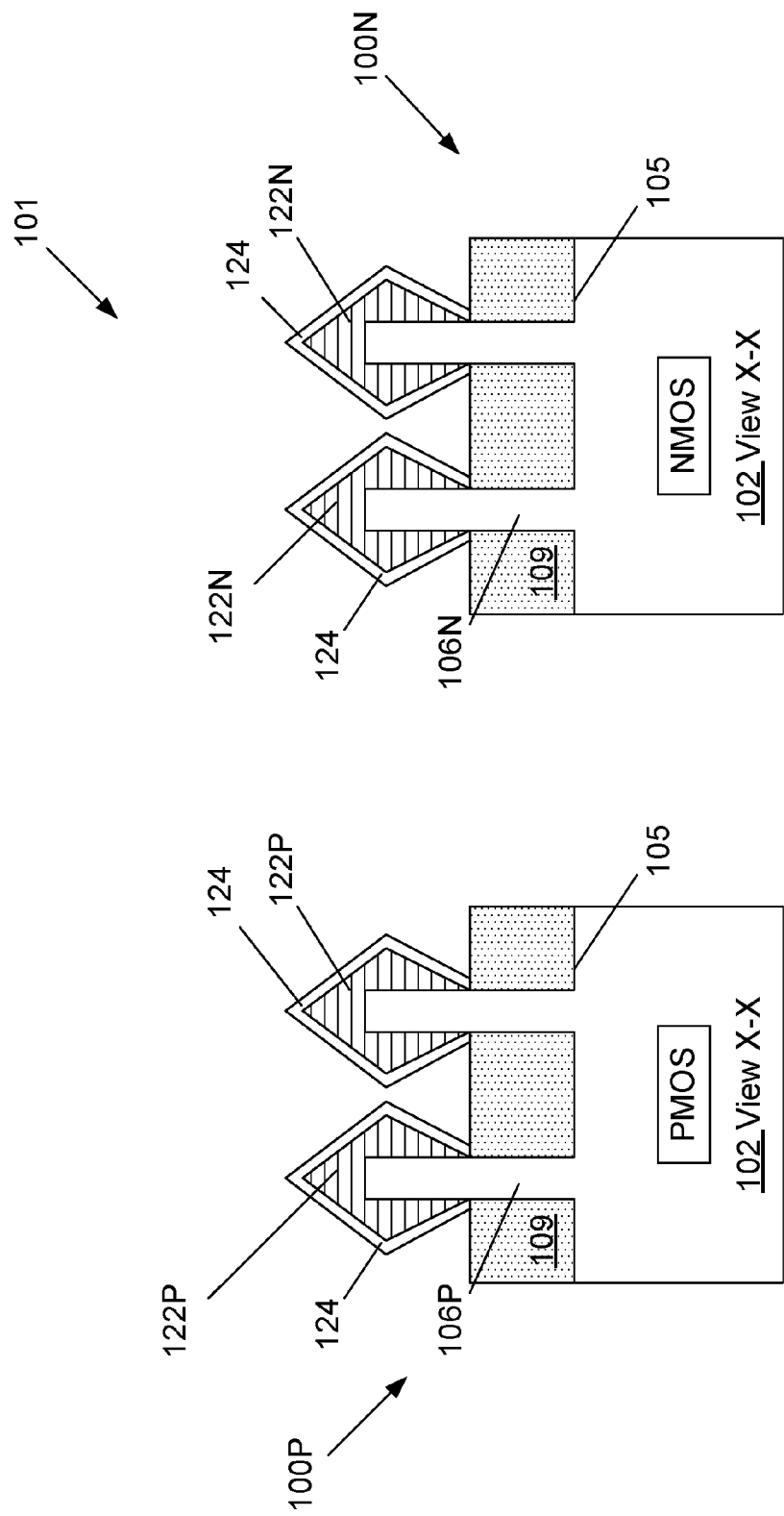
Figure 2U:
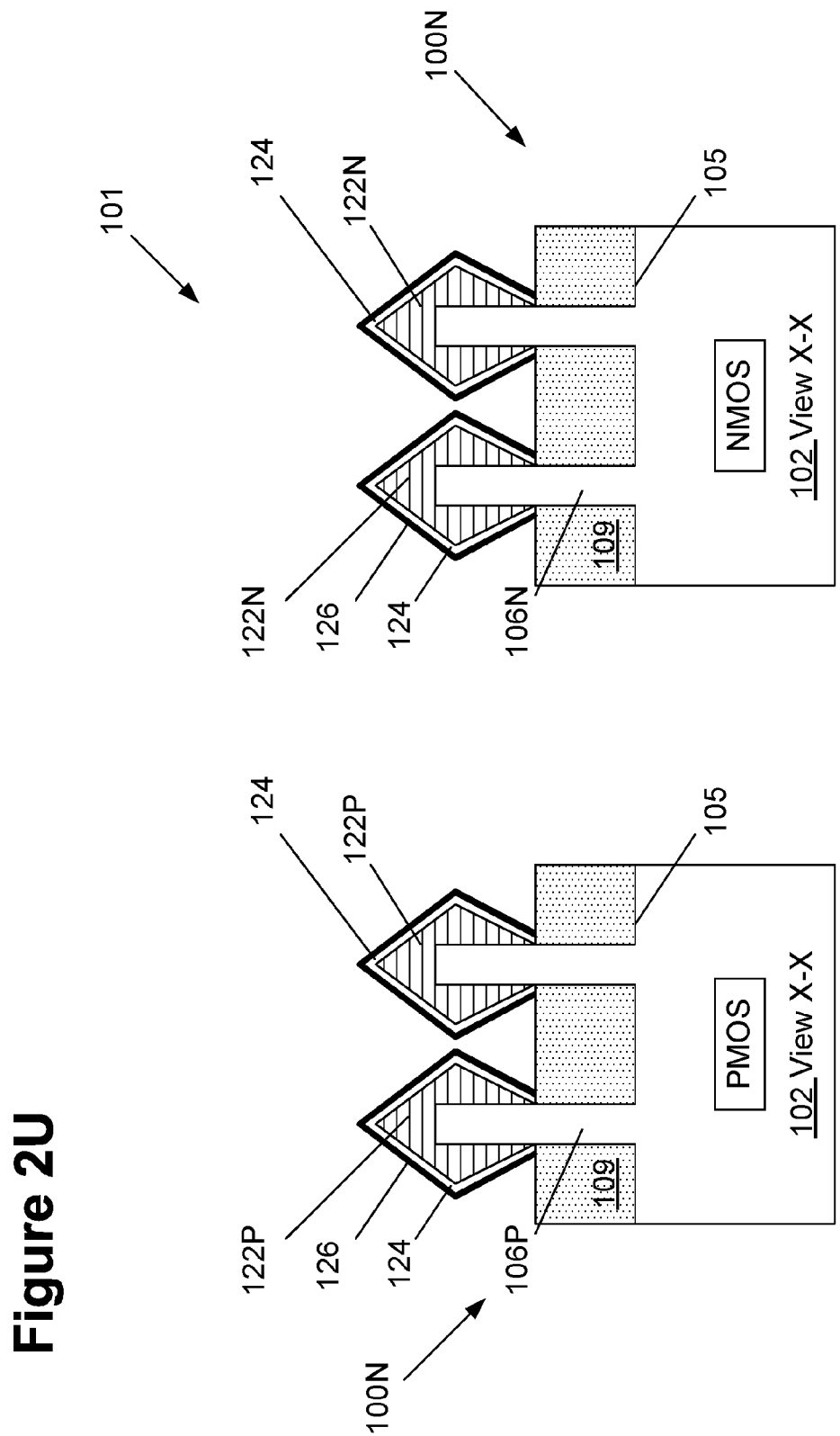

FIGS. 2A-2U present various views of various embodiments of a FinFET device 100 (comprised of two illustrative fins) that may be formed using the methods disclosed herein. The drawings also include a simplistic plan view of the device 100 (in the upper right corner) that depicts the location where various cross-sectional views depicted in the following drawings will be taken. More specifically, the view "X-X" is a cross-sectional view taken through a source/drain region of the device 100 in a direction that is transverse to the long axis of the fins, i.e., in a direction that is substantially parallel to the gate width (GW) direction of the device 100, the view "Y-Y" is a cross-sectional view that is taken through the space between the fins in a direction that is substantially parallel to the gate length direction (GL— i.e., the current transport direction) of the device 100, and the view "Z-Z" is a cross-sectional view that is taken through the long axis of a single fin transverse to the long axis of the gate structure, i.e., in the current transport or gate length direction of the device.

In the examples depicted herein, the FinFET device 100 will be formed in and above a semiconductor substrate 102. The substrate 102 may have a variety of configurations, such as a silicon-on-insulator (SOI) or silicon-germanium-on-insulator (SGOI) that includes a bulk semiconductor layer, a buried insulation layer and an active semiconductor layer positioned above the buried insulation layer. Alternatively, the substrate 102 may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIG. 2A depicts the device 100 at a point in fabrication wherein several process operations have been performed. First, a patterned etch mask 104, e.g., a combination of a silicon dioxide layer (e.g., a pad oxide) and a silicon nitride layer (e.g., a pad nitride), was formed above the substrate 102. In some cases, the pad oxide layer (not separately shown) may be omitted if desired. Thereafter, one or more etching processes were performed through the patterned etch mask 104 so as to define a plurality of fin-formation trenches 105 in the substrate 102. This results in the formation of a plurality of fins 106 defined from the substrate material. The illustrative FinFET device 100 disclosed herein will be depicted as being comprised of two illustrative fins 106. However, as will be recognized by those skilled in the art after a complete reading of the present application, the methods and devices disclosed herein may be employed when manufacturing FinFET devices having any number of fins. With respect of view X-X, the fins 106 extend laterally into and out of the drawing page in the current transport direction of the device 100 and into what will become the source/drain regions of the device 100.

With continuing reference to FIG. 2A, the overall size, shape and configuration of the fin-formation trenches 105 and the fins 106 may vary depending on the particular application. The depth and width of the trenches 105 may vary depending upon the particular application. In one illustrative embodiment, based on current day technology, the overall depth (relative to the upper surface of the substrate 102) of the trenches 105 may range around about 100 nm. In the illustrative examples depicted in the attached figures, the trenches 105 and the fins 106 will be simplistically depicted as having generally rectangular portions and sections. In an actual real-world device, the sidewalls of the fin-formation trenches 105 may be somewhat tapered, although such tapering is not depicted in the drawings. Thus, the size and configuration of the fin-formation trenches 105 and the fins 106, and the manner in which they are made, should not be considered a limitation of the present invention. For ease of disclosure, only the substantially rectangular-shaped trenches 105 and fins 106 having a substantially rectangular-shaped cross-sectional configuration will be depicted in the drawings.

FIG. 2B depicts the FinFET device 100 after a layer of insulating material 109 was formed so as to over-fill the trenches 105 between the fins 106. That is, the layer of insulating material 109 was formed such that its upper surface 109S is positioned above the patterned masking layer 104. The layer of insulating material 109 may be comprised of, for example, silicon dioxide, a HARP oxide, HDP oxide, flowable oxide, etc.

FIG. 2C depicts the FinFET device 100 after one or more CMP processes were performed to remove portions of the layer of insulating material 109 and the patterned hard mask layer 104. These processes result in the layer of insulating material 109 having a polished surface 109X and in the exposure of the upper surface 106S of the fins 106.

FIG. 2D depicts the FinFET device 100 after a timed, recess etching process was performed to remove a portion of the layer of insulating material 109. The recess etching process was performed for a sufficient duration such that the layer of insulating material 109 has a recessed upper surface 109R that is positioned at a desired height level within the trenches 105. This recess etching process exposes the desired final fin height of the fins 106 for the device 100.

The next major process operation involves the formation of a gate structure for the device 100. The methods disclosed herein may be employed in cases where the gate structure is manufactured using any desired technique, e.g., using so-called "gate first" or "replacement gate" manufacturing techniques. By way of illustration only, the gate structure for the FinFET device 100 will be depicted as being formed using a replacement gate process. Accordingly, FIG. 2E depicts the device 100 after a sacrificial gate insulation layer 110, a sacrificial gate structure 116 and a gate cap (hard mask) layer 118 were formed on the device 100 and patterned. In one embodiment, the sacrificial gate insulation layer 110 may be a thermally grown layer of silicon dioxide, the sacrificial gate structure 116 may be made of a material such as polysilicon or amorphous silicon, while the gate cap layer 118 may be made of a material such as silicon nitride. The thickness of these materials may vary depending upon the particular application. FIG. 2E depicts the device 100 after the material of the sacrificial gate structure 116 and the material of the gate cap layer 118 were patterned using traditional masking and etching techniques. Also shown in FIG. 2E is a simplistically depicted sidewall spacer 121 that was formed adjacent the patterned sacrificial gate structure 116 and the patterned gate cap layer 118. The sidewall spacer 121 was formed by depositing a layer of spacer material (e.g., silicon nitride) and thereafter performing an anisotropic etching process. The spacer 121 may be of any desired thickness.

FIG. 2F depicts the FinFET device 100 after additional source/drain epi semiconductor material 122 was formed on portions of the fins 106 positioned laterally outside of the spacers 121, i.e., around and above the three sides of the fins 106 that are positioned above the recessed surface 109R of the layer of insulating material 109. The source/drain epi semiconductor material 122 may be formed by performing traditional epitaxial semiconductor growth processes. The source/drain epi semiconductor material 122 may be comprised of a variety of different materials and different source/drain epi semiconductor materials 122 may be formed on different type devices, e.g., silicon (Si), silicon germanium (SiGe), etc., for PMOS devices, silicon, silicon-carbide (SiC), etc., for NMOS devices. In other applications, the source/drain epi semiconductor material 122 may be the same material for both types of devices, e.g., silicon for both the N and P type devices. As will be appreciated by those skilled in the art after a complete reading of the present application, the silicon-carbide material referenced herein may take a variety of forms, e.g., 3C—SiC, carbon-doped silicon, hydrogen-rich carbon-doped silicon, amorphous silicon-carbide or polycrystalline silicon-carbide. Thus, as used in this detailed description and in the attached claims, the term "silicon-carbide" shall be understood to mean any of the above forms of silicon-carbide material.

In one embodiment, the source/drain epi semiconductor material 122 may be made of a semiconductor material that is different than the semiconductor material of the substrate 102. The source/drain epi semiconductor material 122 also may exhibit a variety of configurations. In the example depicted in FIG. 2F, the source/drain epi semiconductor material 122 has a diamond-like cross-sectional configuration (view X-X) that is a function of the crystallographic orientation of the material of the substrate 102 and the orientation of the fins 106. Of course, the source/drain epi semiconductor material 122 may have a variety of other configurations other than the diamond-like cross-sectional configuration depicted in FIG. 2F.

With continuing reference to FIG. 2F, the source/drain epi semiconductor material 122 may be formed in such a manner so as to result in so-called "merged" or "unmerged" source/drain regions or fins depending on the duration of the epi growth process around the fins 106. FIG. 2F depicts an unmerged condition, i.e., a situation where there is no contact between additional source/drain epi semiconductor materials 122 on the adjacent fins. In other applications, the source/drain epi semiconductor material 122 may be further "embedded" (a situation not shown in the drawings) by recessing the fins 106 in the source/drain regions to a depth slightly below the upper surface of the recessed layer of insulating material 109 and thereafter growing the source/drain epi semiconductor material 122 on the recessed fins 106. Even with the embedded construction, the source/drain epi semiconductor material 122 is still considered to be formed above the fins 106.

With continuing reference to FIG. 2F, at this point, in traditional fabrication processes, a layer of metal silicide would be formed on the source/drain epi semiconductor material 122 so as to reduce the contact resistance between the source/drain epi semiconductor material 122 and the device-level source/drain contact structure (not shown) that will be formed to establish electrical contact to the source/drain region. However, forming an individual metal silicide layer that wraps around each of the separated (unmerged) source/drain epi semiconductor material regions 122 is a very difficult task for several reasons. First, when the source/drain epi semiconductor material 122 is grown on a fin, it is very difficult to control the thickness of the source/drain epi semiconductor material 122. Thus, the source/drain epi material may unintentionally be merged together, thereby preventing the formation of the wrap-around metal silicide layers. One possible solution to avoid such unintended fin merger would be to form the source/drain epi material 122 on the fin to a very small thickness to virtually assure that unintended fin merger does not occur. The drawbacks to this approach are that such a very small volume of source/drain epi material 122 will tend to increase the overall resistance and such a thin layer of source/drain epi material 122 may be substantially consumed by the metal silicide material and/or damaged during the contact formation process. To solve these problems, the inventor has developed a unique method that involves the formation of graphene contacts on the source/drain regions of FinFET devices, thereby eliminating the need to form such metal silicide layers.

FIG. 2G depicts the FinFET device 100 after an additional silicon-carbide (SiC) (as defined above) epi semiconductor material 124 was grown on the source/drain epi semiconductor material 122, around and above the fins 106. In one illustrative embodiment, the additional silicon-carbide (SiC) epi semiconductor material 124 may be grown on the epi semiconductor material 122 for both the N and P type devices formed on the integrated circuit product. As noted above, the source/drain epi semiconductor material 122 for an N-type device may be the same or different semiconductor material than the source/drain epi semiconductor material 122 formed on a P-type device. In other applications, after the formation of the source/drain epi semiconductor material(s) 122 and after formation of appropriate patterned masking layers (not shown), the additional silicon-carbide (SiC) epi semiconductor material 124 may be grown on only one type of transistor device formed on the product, e.g., only on the P-type devices or only on the N-type devices. The silicon-carbide (SiC) epi semiconductor material 124 may be formed by performing traditional epitaxial semiconductor growth processes, and it may be relatively thin, e.g., 2-4 nm. The silicon-carbide (SiC) epi semiconductor material 124 will generally conform to the configuration of the source/drain epi semiconductor material 122. In one embodiment, the silicon-carbide (SiC) epi semiconductor material 124 may be made of a semiconductor material that is different than the semiconductor material of the substrate 102. In one particular example, the silicon-carbide (SiC) epi semiconductor material 124 (as defined above) may be formed on both the silicon-germanium (SiGe) source/drain epi semiconductor material regions 122 of a PMOS device and the silicon-carbide (SiC) source/drain epi semiconductor material regions 122 of an NMOS device. In the case of the NMOS device, the additional layer of silicon-carbide (SiC) (as defined above) epi semiconductor material 124 is positioned on the silicon-carbide (SiC) source/drain epi semiconductor material regions 122.

However, in some applications, the formation of the silicon-carbide epi semiconductor material 124 may not be required. For example, in some applications, the source/drain epi semiconductor material 122 may be made of silicon-carbide, e.g., for N-type devices. In that situation, the methods disclosed herein may be employed to form graphene contacts on only the devices where the source/drain epi semiconductor material 122 may be made of silicon-carbide, e.g., the N-type devices, while an appropriate hard mask layer covers the other devices, e.g., P-type devices.

FIG. 2H depicts the device 100 after a heating process was performed so as to thermally decompose a portion of the silicon-carbide epi semiconductor material 124 and thereby form graphene contacts 126 from the silicon-carbide (SiC) epi semiconductor material 124. An enlarged view of one of the fins in the source/drain region of the device is depicted in FIG. 2H. The heating process was performed so as to sublimate silicon atoms in the above-described silicon-carbon epi semiconductor material 124 so as to thereby form the graphene contacts 126. The graphene contacts 126 may be very thin, e.g., one or two monolayers thick. The graphene contacts 126 will generally conform to the configuration of the epi semiconductor material 124 (when it is present) or to the epi semiconductor material 122 when the additional epi silicon-carbide (SiC) semiconductor material 124 is not formed.

In one illustrative embodiment, for example, when the additional epi silicon-carbide (SiC) semiconductor material 124 is comprised of an amorphous silicon-carbide material, the additional epi silicon-carbide (SiC) semiconductor material 124 may be formed using the methods disclosed in the article by Peng et. al., entitled "Direct Transformation of Amorphous Silicon Carbide into Graphene Under Low Temperature and Ambient Pressure," *Scientific Reports*, published Jan. 28, 2013, which is hereby incorporated by reference in its entirety. In general, the methods involve using a chlorination method under relatively mild reaction conditions of relatively low temperature, e.g., about 600-800° C. and the ambient pressure in chlorine ($Cl_2$) atmosphere. The heating of the product may be accomplished by performing relatively rapid heating processes, such as an RTA process or a laser anneal process. As a specific example, the product may be placed in a process chamber in an atmosphere comprised of substantially pure helium (He). Thereafter, chlorine may be introduced into the process chamber and the product may thereafter be heated to the desired temperature at some point and thus exposed to a He/$Cl_2$ atmosphere for sufficient time to allow formation of the graphene material to the desired thickness, e.g., about 1-5 minutes. In one embodiment, the reaction may be stopped by flushing the process chamber with substantially pure helium gas while maintaining the temperature at about 800° C. for about 1-5 minutes so as to remove the residual chlorine. Thereafter, the process chamber may be allowed to cool to room temperature, about 25° C., in a substantially pure helium environment. In some applications, the heating process may be performed in a furnace wherein the 1-5 minute times mentioned above may be increased, e.g., to a duration of about 1 hour.

Of course, the process conditions and duration may vary depending upon a variety of factors, such as, for example, the thickness of the silicon-carbide (SiC) epi semiconductor material 124. The heating process may be performed using a variety of different types of heating tools and techniques, e.g., laser annealing, RTA chamber, etc. In one example, prior to performing the heating process, all areas of the device other than the source/drain regions where the epi semiconductor material 124 is present, would be masked. Thereafter, a laser annealing process could be performed to scan the particular areas of the substrate where graphene formation is required so as to form the graphene contacts 126. As noted above, an RTA process could also be performed.

The graphene contacts 126 have a significantly lower resistance as compared to traditional metal silicide regions that are normally formed on the source/drain regions, which will help to reduce the overall electrical performance of the resulting FinFET device 100. The formation of the graphene contacts 126 from the epi semiconductor material 124 (e.g., silicon-carbide) is essentially a sublimation process wherein the silicon atoms evaporate and the carbon atoms in the carbon-rich surface of the epi semiconductor material 124 collapse and reconstruct in the form of graphene films. Additionally, the formation of graphene on the epi semiconductor material 124 by sublimation in an argon atmosphere may result in the formation of two types of monolayer graphene with different shapes. For example, relatively long graphene sheets may form along, for example, triple bilayer SiC steps, while relatively narrow graphene ribbons may form by following the surface of a single bilayer SiC height. The relationship between the growth mechanisms and initial surface morphology indicates the effects of $H_2$ etching on the formation of graphene. That is, reducing the number of single bilayer SiC steps with $H_2$ etching tends to result in better graphene formation.

After the formation of the graphene contacts 126, traditional manufacturing techniques may be employed to complete the fabrication of the device 100. Accordingly, FIG. 2I depicts the FinFET device 100 after several process operations were performed. First, using traditional replacement-gate manufacturing techniques, the sacrificial gate structure 116 and the sacrificial gate insulation layer 110 were removed and a replacement gate structure comprised of a high-k (k value of 10 or greater) gate insulation layer 132 and conductive materials 134 (one or more metal layers and/or polysilicon) was formed in its place. Thereafter, the replacement gate materials were recessed and a gate cap layer 136 was formed above the replacement gate structure. Next, insulating material 128 (e.g., silicon dioxide) was formed above the device 100 and source/drain contact structures 130 were formed in openings defined in the insulating material 128 so as to contact the graphene contacts 126 and thereby establish electrical connection with the source/drain regions of the device 100. In the depicted example, the source/drain contact structures 130 are line-type structures that span across both of the fins (in the gate width direction of the device). See view X-X. In other cases, the source/drain contact structures 130 may be individual point-type contacts having a generally cylindrical or rectangular configuration (when viewed from above). The source/drain contact structures 130 may be made of any desired material, e.g., tungsten.

FIGS. 2J-2K depict an embodiment of the device 100 wherein the additional source/drain epi semiconductor material 122 is not formed on the fins 106. Rather, in this embodiment, the silicon-carbide (SiC) epi semiconductor material 124 is formed on the bare fin 106. Starting at the point of fabrication depicted in FIG. 2E (after formation of the sacrificial gate structure), FIG. 2J depicts the device 100 after the above-described silicon-carbide (SiC) epi semiconductor material 124 was grown on the sidewalls and upper surface of the fins 106, and after the above-described heating process was performed to form the above-described graphene contacts 126. FIG. 2K depict the FinFET device 100 after the above-described sacrificial gate structure was removed, after the above-described replacement gate structure was formed and after the above-described source/drain contact structures 130 were formed on the device 100.

FIGS. 2L-2N depict an embodiment of the device 100 wherein the additional source/drain epi semiconductor material 122 is formed in such a manner so that it merges in the source/drain region of the device 100, i.e., the epi growth process is performed for a sufficient duration such that the source/drain epi semiconductor material 122 forms a more or less continuous region of source/drain epi semiconductor material 122 in the source/drain regions of the device that is positioned above and around the fins 106. That is, starting at the point of fabrication depicted in FIG. 2E (after formation of the sacrificial gate structure), FIG. 2L depicts the device 100 after the above-described source/drain epi semiconductor material 122 was grown on the sidewalls and upper surface of the fins 106, i.e., above and around the fins 106, until such time as a substantially continuous region of the source/drain epi semiconductor material 122 was formed in the source/drain regions of the device 100. Thereafter, as shown in FIG. 2M, the above-described silicon-carbide (SiC) epi semiconductor material 124 was grown on the upper surface of the merged source/drain epi semiconductor material regions 122 and the above-described heating process was performed to form the above-described graphene contacts 126 on the upper surface of the merged source/drain epi semiconductor material regions 122. FIG. 2N depicts the FinFET device 100 after the above-described sacrificial gate structure was removed, after the above-described replacement gate structure was formed and after the above-described source/drain contact structures 130 were formed on the device 100.

The methods disclosed herein may also be employed in cases wherein the fin structure is comprised of an alternative semiconductor material. Accordingly, FIG. 2O depicts the device 100 wherein the overall fin structure is comprised of an alternative semiconductor material 106X that is made of a semiconductor material that is different from the semiconductor material of the substrate 102. For example, in the case where the substrate 102 is made of silicon, the alternative semiconductor material 106X may be made of a compressively stressed silicon-germanium material for a PMOS device or a tensile stressed silicon-carbide material for an NMOS device. Such alternative materials 106X are formed in an effort to increase the current carrying capabilities of the FinFET devices. The alternative semiconductor material 106X may be a germanium-containing material $Si_xGe_{(1-x)}$ (where x ranges from 0.1 to about 0.9) such as $Si_{0.75}Ge_{0.25}$ or the alternative semiconductor material 106X may also be made of one or more III-V semiconductor materials (or combinations thereof). The thickness (vertical height) of the alternative semiconductor material 106X may vary depending upon the particular application, e.g., about 30-40 nm in one illustrative embodiment. Thus, the alternative semiconductor material 106X referenced herein should not be considered to be limited to any particular semiconductor material. The alternative semiconductor material 106X may be formed using a variety of techniques. For example, starting at the point of fabrication depicted in FIG. 2C (prior to recessing the layer of insulating material 109), the fins 106 may be recessed so as to define a trench in the insulating material 109 above the recessed fins. Then, an epi growth process may be performed to form the alternative semiconductor material 106X on the recessed fins and in the trench in the insulating layer 109. At that point, the device may be processed as described above, e.g., recessing of the layer of insulating material to expose the desired final fin height of the fins, etc. In another illustrative embodiment, the alternative semiconductor material 106X may be formed in the substrate 102 by initially forming a trench in the substrate 102, performing an epi deposition process to form the alternative semiconductor material layer 106X in the trench and thereafter performing a chemical mechanical planarization (CMP) process. After that process, the fin-formation trenches 105 may be formed in the substrate 102 so as to define some fins 106 that are comprised of only the material of the substrate 102 and to define some fins that are comprised of the material of the substrate 102 as well as the alternative semiconductor material 106X. Other techniques also exist for forming fins for FinFET devices that are comprised of such an alternative semiconductor material 106X. In the embodiment shown in FIG. 2O, additional source/drain epi semiconductor material 122 was formed in an unmerged condition, the above-described additional silicon-carbide (SiC) epi semiconductor material 124 was grown on the source/drain epi semiconductor material 122, and the above-described heating process was performed to form the above-described graphene contacts 126.

FIG. 2P depicts the device 100 wherein the overall fin structure is comprised of an alternative semiconductor material 106X and wherein the additional source/drain epi semiconductor material 122 is not formed on the fins 106. Rather, in this embodiment, the silicon-carbide (SiC) epi semiconductor material 124 is formed on the bare alternative semiconductor material 106X. This embodiment is similar to that depicted in FIGS. 2J-2K except that the overall fin structure is comprised of the alternative semiconductor material 106X.

FIG. 2Q depicts the device 100 wherein the overall fin structure is comprised of an alternative semiconductor material 106X that is formed in such a manner so that it merges in the source/drain region of the device 100, i.e., the epi growth process is performed for a sufficient duration such that the source/drain epi semiconductor material 122 forms a more or less continuous region of source/drain epi semiconductor material 122 in the source/drain regions of the device that is positioned above and around the fins 106. This embodiment is similar to that depicted in FIGS. 2L-2N except that the overall fin structure is comprised of the alternative semiconductor material 106X.

FIGS. 2R-2U depict various illustrative examples of using the methods disclosed herein for the above-described graphene contacts 126 on a CMOS based integrated circuit product 101 that includes an illustrative PMOS transistor 100P and an illustrative NMOS transistor 100N that are formed in and above the substrate 102. FIGS. 2R-2U depict only the cross-sectional views section of the transistors 100P, 100N taken through a source/drain region in the gate width direction of the devices (view X-X). To the extent that the various structures in each of the individual devices 100P, 100N is made, such reference will be made to PMOS and NMOS terminology along with reference numbers with the added "P" or "N" designation.

Starting at the point of fabrication depicted in FIG. 2E (after formation of the sacrificial gate structure), FIG. 2R depicts the CMOS product 101 after several process operations were performed. First, a simplistically depicted NMOS patterned hard mask layer 150, made of a material such as silicon nitride, was formed above the NMOS transistor 100N. The NMOS hard mask layer 150 may be formed by blanket-depositing the NMOS hard mask layer 150 across the CMOS product 101 and, thereafter, forming an etch mask layer (not shown), e.g., such as a photoresist mask, that covers the area where the NMOS transistor 100N is formed and exposes the area where the PMOS transistor 100P is formed. Then an anisotropic etching process was performed to remove the portions of the NMOS hard mask layer 150 from above the PMOS transistor 100P so as to expose the PMOS transistor 100P, and particularly the portions of the fins 106P in the source/drain regions of the device 100P, for further processing. Next, additional source/drain epi semiconductor material 122P was formed on portions of the fins 106P positioned laterally outside of the spacers 121. As noted above, in one embodiment, the source/drain epi semiconductor material 122P may be a compressively stress SiGe semiconductor material.

FIG. 2S depicts the CMOS product 101 after several process operations were performed. First, the NMOS patterned hard mask layer 150 was removed. Then, a simplistically depicted PMOS patterned hard mask layer 154, made of a material such as silicon nitride, was formed above the PMOS transistor 100P using the techniques described above for forming the NMOS hard mask layer 150. The patterned PMOS hard mask layer 154 exposes the NMOS transistor 100N, and particularly the portions of the fins 106N in the source/drain regions of the device 100N, for further processing. Next, additional source/drain epi semiconductor material 122N was formed on portions of the fins 106N positioned laterally outside of the spacers 121. As noted above, in one embodiment, the source/drain epi semiconductor material 122M may be a tensile stressed silicon-carbide (SiC) semiconductor material.

FIG. 2T depicts the CMOS product 101 after several process operations were performed. First, the PMOS patterned hard mask layer 154 was removed. Then, the above-described additional silicon-carbide (SiC) epi semiconductor material 124 was grown on the additional source/drain epi semiconductor materials 122P and 122N for the devices 100P, 100N, respectively.

FIG. 2U depicts the CMOS product 101 after the above-described heating process was performed to form the above-described graphene contacts 126 on the source/drain regions of both the PMOS transistor 100P and the NMOS transistor 100N. At this point in fabrication, replacement gate structures may be formed for each of the devices and the above-described source/drain contact structures 130 may be formed on the CMOS product 101.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method forming a FinFET device comprised of a source region and a drain region that are positioned on opposite sides of a gate structure, comprising:
   forming a fin in a semiconductor substrate comprised of a first semiconductor material;
   forming said gate structure above a portion of said fin;
   performing a first epitaxial growth process to form a silicon-carbide (SiC) semiconductor material above said fin in said source and drain regions of said FinFET device, said silicon-carbide (SiC) semiconductor material being a different semiconductor material than said first semiconductor material of said substrate;
   performing a heating process so as to form a source/drain graphene contact from said silicon-carbide (SiC) semiconductor material in both said source and drain regions of said FinFET device; and
   forming first and second source/drain contact structures that are conductively coupled to said source/drain graphene contact in said source region and said drain region, respectively, of said FinFET device.

2. The method of claim 1, wherein said silicon-carbide (SiC) semiconductor material comprises one of 3C—SiC, a carbon-doped silicon, a hydrogen-rich carbon-doped silicon, an amorphous silicon-carbide or a polycrystalline silicon-carbide.

3. The method of claim 1, wherein, prior to performing said first epitaxial growth process, the method comprises performing a second epitaxial growth process to form a source/drain epi semiconductor material on said fin, wherein said source/drain epi semiconductor material is different from said first semiconductor material of said substrate and wherein performing said first epitaxial growth process comprises performing said first epitaxial growth process so as to form said silicon-carbide (SiC) semiconductor material on and in physical contact with said source/drain epi semiconductor material.

4. The method of claim 1, wherein performing said heating process so as to form said source/drain graphene contact comprises performing said heating process at a temperature that falls within a range of about 600-800° C.

5. The method of claim 1, wherein said fin is made entirely of said first semiconductor material.

6. The method of claim 5, wherein performing said first epitaxial growth process comprises performing said first epitaxial growth process so as to form said silicon-carbide (SiC) semiconductor material on and in physical contact with said first semiconductor material that comprises said fin.

7. The method of claim 1, wherein a lower portion of said fin is made of said first semiconductor material and an upper portion of said fin is made of a third semiconductor material that is different from said first semiconductor material.

8. The method of claim 7, wherein said third semiconductor material is comprised of one of silicon germanium ($Si_xGe_{(1-x)}$ (where x ranges from 0.1 to about 0.9)) or at least one III-V semiconductor material.

9. The method of claim 1, wherein forming said gate structure comprises forming a sacrificial gate structure.

10. The method of claim 1, wherein forming said gate structure comprises forming a final gate structure for said FinFET device.

11. A method forming a FinFET device comprised of a source region and a drain region that are positioned on opposite sides of a gate structure, comprising:
    forming a fin in a substrate comprised of a first semiconductor material;
    forming said gate structure above a portion of said fin;
    performing a first epitaxial growth process to form a source/drain epi semiconductor material on said fin, wherein said source/drain epi semiconductor material is a different semiconductor material from said first semiconductor material of said substrate;
    performing a second epitaxial growth process to form a silicon-carbide (SiC) semiconductor material on and in contact with said source/drain epi semiconductor material in said source and drain regions of said FinFET device, said silicon-carbide (SiC) semiconductor material being a different semiconductor material than said first semiconductor material of said substrate;
    performing a heating process so as to form, via sublimation, a source/drain graphene contact from said silicon-carbide (SiC) semiconductor material in both said source and drain regions of said FinFET device; and
    forming first and second source/drain contact structures that are conductively coupled to said source/drain graphene contact in said source region and said drain region, respectively, of said FinFET device.

12. The method of claim 11, wherein said FinFET device is a PMOS FinFET device and wherein said second semiconductor material is silicon germanium ($Si_xGe_{(1-x)}$ (where x ranges from 0.1 to about 0.9)) and wherein performing said second epitaxial growth process comprises performing said second epitaxial growth process so as to form said silicon-carbide (SiC) semiconductor material on and in contact with said source/drain epi semiconductor material.

13. The method of claim 11, wherein said FinFET device is an NMOS FinFET device and wherein said second semiconductor material is silicon-carbide (SiC) and wherein performing said second epitaxial growth process comprises performing said second epitaxial growth process so as to form said silicon-carbide (SiC) semiconductor material on and in contact with said source/drain epi semiconductor material.

14. The method of claim 11, wherein performing said heating process so as to form said source/drain graphene contact comprises performing said heating process at a temperature that falls within a range of about 600-800° C.

15. The method of claim 11, wherein said fin is made entirely of said first semiconductor material.

16. The method of claim 11, wherein a lower portion of said fin is made of said first semiconductor material and an upper portion of said fin is made of a third semiconductor material that is a different semiconductor material than said first semiconductor material.

17. The method of claim 16, wherein said third semiconductor material is comprised of one of silicon germanium ($Si_xGe_{(1-x)}$ (where x ranges from 0.1 to about 0.9)) or at least one III-V semiconductor material.

18. A method of forming an integrated circuit product comprised of a PMOS FinFET device and an NMOS FinFET device, each of said FinFET devices comprising a source region and a drain region that are positioned on opposite sides of a gate structure, comprising:
    forming first and second fins in a substrate comprised of a first semiconductor material, said first and second fins being formed for said PMOS FinFET device and said NMOS FinFET device, respectively;
    forming first and second gate structures above a portion of said first and second fins, respectively;
    forming a first source/drain epi second semiconductor material on said first fin in said source and drain regions of said PMOS FinFET device, wherein said first source/drain epi second semiconductor material is a different semiconductor material than said first semiconductor material of said substrate;
    forming a second source/drain epi semiconductor material on said second fin in said source and drain regions of said NMOS FinFET device, wherein said second source/drain epi semiconductor material is a different semiconductor material from said first semiconductor material and said second source/drain epi semiconductor material;
    forming a silicon-carbide (SiC) semiconductor material on and in contact with said first source/drain epi semiconductor material in said source and drain regions of said PMOS FinFET device and on and in contact with said second source/drain epi semiconductor material in said source and drain regions of said NMOS device, said silicon-carbide (SiC) semiconductor material being a different semiconductor material than said first semiconductor material of said substrate;
    performing a heating process so as to form, via sublimation, a source/drain graphene contact from said silicon-carbide (SiC) semiconductor material in both said source and drain regions of both said PMOS and NMOS FinFET devices; and
    forming a plurality of source/drain contact structures, each of which is conductively coupled to one of said source/drain graphene contacts.

19. The method of claim 18, wherein said first source/drain epi semiconductor material is silicon germanium ($Si_xGe_{(1-x)}$ (where x ranges from 0.1 to about 0.9)).

20. The method of claim 19, wherein said second source/drain epi semiconductor material is silicon-carbide (SiC).

21. The method of claim 20, wherein performing said heating process so as to form said source/drain graphene contact comprises performing said heating process at a temperature that falls within a range of about 600-800° C.

22. The method of claim 18, wherein said first and second fins are made entirely of said first semiconductor material.

23. The method of claim 18, wherein a lower portion of each of said first and second fins is made of said first semiconductor material and an upper portion of each of said first and second fins is made of a fourth semiconductor material that is a different semiconductor material than that of said first semiconductor material.

24. The method of claim 23, wherein said fourth semiconductor material is comprised of one of silicon germanium $Si_xGe_{(1-x)}$ (where x ranges from 0.1 to about 0.9) or at least one III-V semiconductor material.

* * * * *